(12) United States Patent
Igarashi

(10) Patent No.: US 12,080,636 B2
(45) Date of Patent: Sep. 3, 2024

(54) SEMICONDUCTOR PACKAGE AND MANUFACTURING METHOD OF SEMICONDUCTOR PACKAGE

(71) Applicant: SONY SEMICONDUCTOR SOLUTIONS CORPORATION, Kanagawa (JP)

(72) Inventor: Koichi Igarashi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 350 days.

(21) Appl. No.: 17/310,851

(22) PCT Filed: Dec. 9, 2019

(86) PCT No.: PCT/JP2019/048095
§ 371 (c)(1),
(2) Date: Aug. 26, 2021

(87) PCT Pub. No.: WO2020/183822
PCT Pub. Date: Sep. 17, 2020

(65) Prior Publication Data
US 2022/0084921 A1 Mar. 17, 2022

(30) Foreign Application Priority Data
Mar. 12, 2019 (JP) ................ 2019-045100

(51) Int. Cl.
*H01L 23/498* (2006.01)
*H01L 23/00* (2006.01)
*H01L 27/146* (2006.01)

(52) U.S. Cl.
CPC .. *H01L 23/49816* (2013.01); *H01L 23/49822* (2013.01); *H01L 24/03* (2013.01);
(Continued)

(58) Field of Classification Search
CPC ......... H01L 23/49816; H01L 23/49822; H01L 24/03; H01L 24/05; H01L 24/16;
(Continued)

(56) References Cited

U.S. PATENT DOCUMENTS

| 2001/0018236 A1 | 8/2001 | Badehi |
| 2012/0205789 A1* | 8/2012 | Natsuaki ............... H01L 25/50 |
| | | 257/676 |
| 2015/0249191 A1 | 9/2015 | Takeuchi et al. |

FOREIGN PATENT DOCUMENTS

| JP | 9-266231 A | 10/1997 |
| JP | 2001-352021 A | 12/2001 |

(Continued)

OTHER PUBLICATIONS

International Search Report and Written Opinion of PCT Application No. PCT/JP2019/048095, issued on Mar. 10, 2020, 10 pages of ISRWO.

*Primary Examiner* — Douglas W Owens
(74) *Attorney, Agent, or Firm* — CHIP LAW GROUP

(57) ABSTRACT

In a semiconductor package in which a semiconductor substrate is mounted, thermal resistance of the semiconductor substrate is reduced. The semiconductor package includes a semiconductor substrate, an insulating layer, a metal layer, an interposer substrate, a mounting substrate, a signal transmission solder ball, and a solder member. A pad is provided on one surface of the semiconductor substrate. A different surface of the semiconductor substrate is covered with the insulating layer. The metal layer covers the insulating layer. A wire to be connected to the pad is formed on the interposer substrate. The signal transmission solder ball is jointed to the wire and the mounting substrate, and transmits a predetermined electrical signal. The solder member is jointed to the metal layer and the mounting substrate.

14 Claims, 21 Drawing Sheets

(52) U.S. Cl.
CPC .............. *H01L 24/05* (2013.01); *H01L 24/16*
(2013.01); *H01L 27/14618* (2013.01); *H01L
2224/0219* (2013.01); *H01L 2224/03019*
(2013.01); *H01L 2224/0347* (2013.01); *H01L
2224/0401* (2013.01); *H01L 2224/05647*
(2013.01); *H01L 2224/16225* (2013.01)

(58) Field of Classification Search
CPC ....... H01L 27/14618; H01L 2224/0219; H01L
2224/03019; H01L 2224/0347; H01L
2224/0401; H01L 2224/05647; H01L
2224/16225; H01L 2224/16111; H01L
2924/10158; H01L 23/36; H01L
2224/73253
See application file for complete search history.

(56) References Cited

FOREIGN PATENT DOCUMENTS

| | | | |
|---|---|---|---|
| JP | 2003-516634 | A | 5/2003 |
| JP | 2004031897 | A | 1/2004 |
| JP | 2006165180 | A | 6/2006 |
| JP | 2009206496 | A | 9/2009 |
| JP | 2015-162651 | A | 9/2015 |
| JP | 2018-093162 | A | 6/2018 |
| KR | 10-2018-0064743 | A | 6/2018 |
| WO | 2017/014072 | A1 | 1/2017 |

* cited by examiner

SEMICONDUCTOR PACKAGE AND MANUFACTURING METHOD OF SEMICONDUCTOR PACKAGE

CROSS REFERENCE TO RELATED APPLICATIONS

This application is a U.S. National Phase of International Patent Application No. PCT/JP2019/048095 filed on Dec. 9, 2019, which claims priority benefit of Japanese Patent Application No. JP 2019-045100 filed in the Japan Patent Office on Mar. 12, 2019. Each of the above-referenced applications is hereby incorporated herein by reference in its entirety.

TECHNICAL FIELD

The present technology relates to a semiconductor package and a manufacturing method of a semiconductor package. More specifically, the present technology relates to a semiconductor package in which a semiconductor substrate is mounted on a mounting substrate via an interposer substrate, and a manufacturing method of a semiconductor package.

BACKGROUND ART

For the purpose of facilitating the handling of a semiconductor integrated circuit, or the like, a semiconductor package in which the semiconductor integrated circuit is mounted on a substrate and sealed has been conventionally used. There are various types of such semiconductor packages. Among these semiconductor packages, in a case where a great number of terminals is required, a fan-out package in which terminals are spread up to the outside of the semiconductor substrate like a fan is used (for example, refer to Patent Document 1). Furthermore, as a mounting example of a fan-out package, there is a structure in which a semiconductor substrate, an interposer substrate connected to a terminal of the semiconductor substrate, and a mounting substrate connected to the interposer substrate by solder balls are provided.

CITATION LIST

Patent Document

Patent Document 1: WO 2017/014072 A

SUMMARY OF THE INVENTION

Problems to be Solved by the Invention

In a fan-out package that uses the above-described interposer substrate, a semiconductor substrate and a mounting substrate are electrically connected via the interposer substrate and solder balls, and a semiconductor integrated circuit on the semiconductor substrate is driven by a drive circuit on the mounting substrate. However, in this fan-out package, it is difficult to decrease an amount of rise in temperature (i.e., thermal resistance) per unit time of the semiconductor substrate when the semiconductor integrated circuit is driven. Even if heat is released to the mounting substrate from the semiconductor substrate via solder balls, in a case where an amount of heat generation of the semiconductor substrate is large, there is concern that an amount of heat release becomes insufficient only by solder ball. If an amount of heat release is increased by filling a clearance between substrates that is provided for preventing damages to the substrates, with resin as underfill resin, because a thermal conductivity of resin is not higher than that of metal, it is difficult to sufficiently decrease thermal resistance.

The present technology has been devised in view of such a situation, and aims to reduce thermal resistance of a semiconductor substrate in a semiconductor package in which the semiconductor substrate is mounted.

Solutions to Problems

The present technology has been devised for solving the above-described problematic points, and the first aspect thereof is a semiconductor package including a semiconductor substrate having one surface on which a pad is provided, an insulating layer configured to cover a different surface of the semiconductor substrate, a metal layer configured to cover the insulating layer, an interposer substrate on which a wire to be connected to the pad is formed, a signal transmission solder ball that is to be jointed to the wire and a predetermined mounting substrate, and configured to transmit a predetermined electrical signal, and a solder member to be jointed to the metal layer and the mounting substrate. Therefore, a function of releasing heat of the semiconductor substrate via the solder member is caused.

Furthermore, in the first aspect, the solder member may include a plurality of heat release solder balls. Therefore, a function of releasing heat of the semiconductor substrate via the plurality of heat release solder balls is caused.

Furthermore, in the first aspect, a shape of the solder member may be a plate shape. Therefore, a function of releasing heat of the semiconductor substrate via the plate-shaped solder member is caused.

Furthermore, in the first aspect, an opening may be formed on the different surface of the semiconductor substrate, the insulating layer may cover the opening, and the metal layer may be buried in the opening. Therefore, a function of releasing heat of the semiconductor substrate via the metal layer buried in the opening and the solder member is caused.

Furthermore, in the first aspect, material of the insulating layer may be ceramic. Therefore, a function of releasing heat of the semiconductor substrate via the ceramic insulating layer and the solder member is caused.

Furthermore, in the first aspect, the ceramic may be alumina. Therefore, a function of releasing heat of the semiconductor substrate via the alumina insulating layer and the solder member is caused.

Furthermore, in the first aspect, the ceramic may be silicon carbide. Therefore, a function of releasing heat of the semiconductor substrate via the silicon carbide insulating layer and the solder member is caused.

Furthermore, in the first aspect, material of the metal layer may contain copper. Therefore, a function of releasing heat of the semiconductor substrate via the solder member jointed to the copper metal layer is caused.

Furthermore, in the first aspect, a lid member connected to the interposer substrate may be further included, and a solid-state image sensor may be further formed on the semiconductor substrate. Therefore, a function of releasing heat of the solid-state image sensor is caused.

Furthermore, the second aspect of the present technology is a manufacturing method of a semiconductor package including an insulating layer coating procedure of forming a film of an insulating layer on a different surface of a semiconductor substrate having one surface on which a pad is provided, a metal layer coating procedure of forming a film of a metal layer on the insulating layer, a bonding procedure of connecting a wire formed on an interposer substrate, to the pad, and a jointing procedure of jointing a signal transmission solder ball configured to transmit a predetermined electrical signal, to the wire, and jointing a solder member to the metal layer. Therefore, a function of manufacturing the semiconductor package from which heat of the semiconductor substrate is released via the solder member is caused.

Furthermore, in the second aspect, the solder member may have a plate shape. Therefore, a function of releasing heat of the semiconductor substrate via the plate-shaped solder member is caused.

Furthermore, in the second aspect, a mounting procedure of mounting a plurality of heat release solder balls on the metal layer may be further included, and in the jointing procedure, the solder member may be formed by merging the plurality of heat release solder balls. Therefore, a function of forming the plate-shaped solder member by the merging of the plurality of heat release solder balls is caused.

Furthermore, in the second aspect, in the jointing procedure, the solder member may be formed by applying cream solder to the metal layer. Therefore, a function of forming the plate-shaped solder member by application of the cream solder is caused.

Furthermore, in the second aspect, an opening procedure of forming an opening by opening the different surface of the semiconductor substrate by etching may be further included, in the insulating layer coating procedure, a film of the insulating layer may be formed on an opening surface of the opening, and in the metal layer coating procedure, the metal layer may be buried in the opening. Therefore, a function of manufacturing the semiconductor package in which the metal layer is buried in the opening is caused.

MODE FOR CARRYING OUT THE INVENTION

Hereinafter, a mode for carrying out the present technology (hereinafter, referred to as an embodiment) will be described. The description will be given in the following order.

1. First Embodiment (Example of Jointing Metal Layer and Mounting Substrate by Ball-Shaped Solder Member)
2. Second Embodiment (Example of Jointing Metal Layer and Mounting Substrate by Plate-Shaped Solder Member)
3. Third Embodiment (Example of Jointing Metal Layer Buried in Opening and Mounting Substrate by Ball-Shaped Solder Member)
4. Fourth Embodiment (Example of Jointing Metal Layer Buried in Opening and Mounting Substrate by Plate-Shaped Solder Member)
5. Application Example to Movable Body

1. First Embodiment

[Configuration Example of Fan-Out Package]

Figure 1:
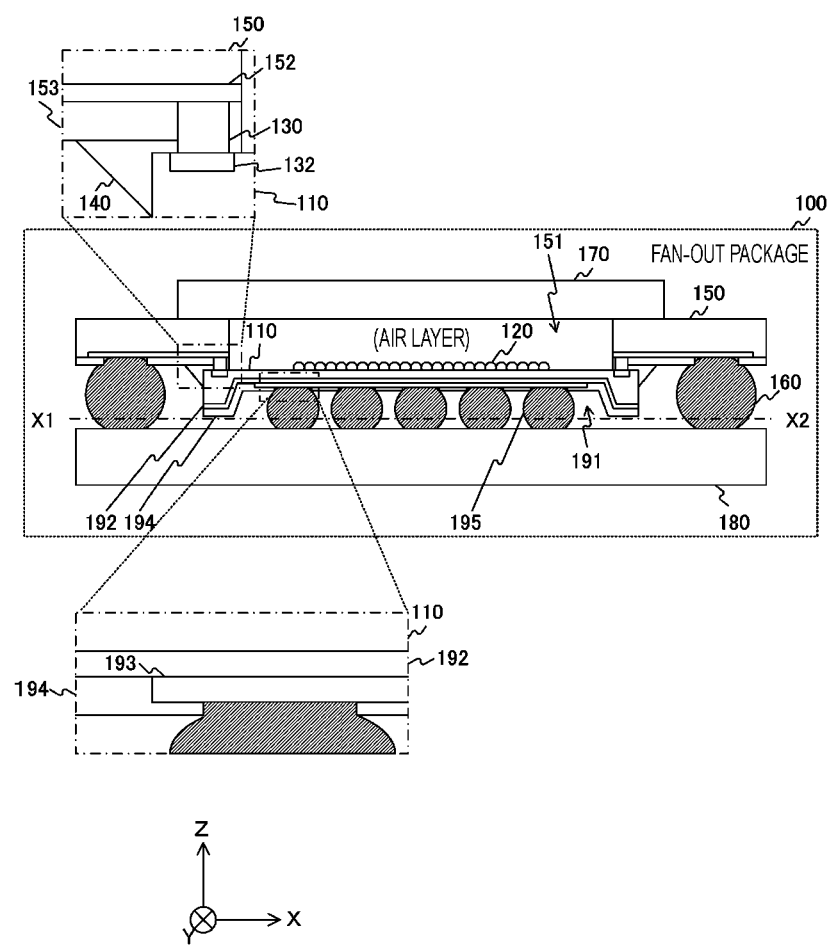
FIG. 1 is a cross-sectional view illustrating one configuration example of a fan-out package according to a first embodiment of the present technology.

FIG. 1 is a cross-sectional view illustrating one configuration example of a fan-out package 100 according to the first embodiment of the present technology. In the fan-out package 100, three substrates corresponding to a semiconductor substrate 110, an interposer substrate 150, and a mounting substrate 180 are disposed. Note that the fan-out package 100 is an example of a semiconductor package described in the appended claims.

First of all, the semiconductor substrate 110 will be described. The semiconductor substrate 110 is a silicon substrate. A semiconductor integrated circuit such as a solid-state image sensor 120 is formed on one surface of both surfaces of the semiconductor substrate 110. Hereinafter, out of the both surfaces of the semiconductor substrate 110, a surface on which the solid-state image sensor 120 is formed will be referred to as a "light reception surface", and a surface opposed to the light reception surface will be referred to as a "rear surface". Furthermore, a predetermined direction parallel to the light reception surface will be referred to as an "X direction", and a direction vertical to the light reception surface will be referred to as a "Z direction". A direction vertical to the X direction and the Z direction will be referred to as a "Y direction".

Next, the solid-state image sensor 120 will be described. The solid-state image sensor 120 generates image data by photoelectric conversion. Here, a solid-state image sensor having a structure in which a photodiode is disposed on a font surface on which a circuit is disposed, out of both surfaces of the solid-state image sensor is generally called a Front Side Illumination (FSI) solid-state image sensor. On the other hand, a solid-state image sensor having a structure in which a photodiode is disposed on a rear surface opposing the front surface is called a Back Side Illumination (BSI) solid-state image sensor. The structure of the solid-state image sensor 120 may be whichever of the FSI and the BSI.

A stud bump 130 and a pad 132 will be described. A plurality of pads 132 is provided along the outer periphery of the light reception surface of the semiconductor substrate 110. These pads 132 are electrodes for communicating a predetermined electrical signal such as a pixel signal, with the outside of the solid-state image sensor 120.

Furthermore, the stud bump 130 is provided for each of the pads 132. The stud bump 130 is connected with a pad (not illustrated) on the interposer substrate 150 side. A mounting technology of connecting members using a bump without using a wire in this manner is called flip-chip packaging.

Furthermore, for protecting the stud bump 130 and preventing dust from being mixed into a cavity 151 to be described later, a seal resin 140 is formed on the outer periphery of the semiconductor substrate 110. For example, thermoset resin such as epoxy resin is used as the seal resin 140. Note that ultraviolet curable resin can be used in place of thermoset resin. Furthermore, the seal resin 140 may be resin mixed with a filler being inorganic material such as ceramic, or may include only resin not mixed with filler or the like.

The interposer substrate 150 will be described. The interposer substrate 150 has a structure in which glass fiber called an organic substrate, for example, is impregnated with epoxy resin, a copper wire is buried in the layer, and an interposer wire 152 is exposed by opening a part of a solder mask 153. In many cases, the interposer substrate 150 include material of Flame Retardant type 4 (FR4) or FR5, for example. Nevertheless, aside from the FR4 and the FR5, material development has recently advanced, and material with a low coefficient of thermal expansion (CTE), and suppressed influence of a usage temperature difference in a market environment has also emerged. Thus, the material of the interposer substrate 150 is not limited to the FR4 and the FR5, and is appropriately selected in accordance with a usage environment or the like of the fan-out package 100.

Furthermore, in a case where only a simple surface layer wire is used, or in a case where it is difficult to lay out wires only in a surface layer, a through-hole substrate, a subcomposite, or the like can be used as the interposer substrate 150. Here, the through-hole substrate is a substrate that uses a through-hole via, and for example, has a configuration in which all layers of a plurality of layers are penetrated by a drill, and a through-hole obtained by covering the inside with copper plating, and a through-hole via is disposed. On the other hand, the subcomposite is a substrate in which an interlayer via is opened using laser or the like, and an upper layer and a lower layer are brought into contact via copper plating.

Furthermore, a center part of the interposer substrate 150 is opened for taking outside light into the solid-state image sensor 120 via a lid member 170 to be described later. For example, a method of opening the interposer substrate 150 using a method such as punching or a drill after the generation, or a method of generating the interposer substrate 150 having a structure of being opened preliminarily is used for the formation of the cavity 151. Note that a formation method is not limited to these methods, and any method may be used as long as the method can ensure dimension accuracy of a shape, and does not generate burr or a crack of an opened end surface.

The cavity 151 will be described. A space separated from the outside by an opening of the interposer substrate 150, the solid-state image sensor 120, and the lid member 170 to be described later corresponds to the cavity 151. Incident light from the outside of the fan-out package 100 changes in incident angle in accordance with a refractive index of the lid member 170. The inside of the cavity 151 corresponds to an air layer having a refractive index of about "1". Thus, as for an on-chip lens of the solid-state image sensor 120, an incident angle reflecting the incident angle of the lid member 170 can be reproduced.

Signal transmission solder balls 160 will be described. The interposer wire 152 and the mounting substrate 180 are jointed by the signal transmission solder balls 160. Furthermore, the signal transmission solder balls 160 transmit a predetermined electrical signal such as a pixel signal or a drive signal. In view of environmental problems, lead-free material is often used as the material of the signal transmission solder balls 160. The material is appropriately selected depending on products and required cost. Furthermore, the signal transmission solder balls 160 are manufactured using a method of accurately placing solder balls with a uniformed sized in a state in which flux is applied to an opening of the solder mask 153 of the interposer substrate 150, for example. Alternatively, the signal transmission solder balls 160 are manufactured using a method of printing solder paste onto the opening of the solder mask 153 by a printing technology, and then forming solder into a ball shape by performing reflow.

The lid member 170 will be described. The lid member 170 is connected to an end of the interposer substrate 150. As the lid member 170, a glass plate, a plastic plate, or a silicon plate that lets through only infrared light is used. An optical unit (not illustrated) such as a lens is disposed above the lid member 170. The lid member 170 lets through incident light from the optical unit, transmits the light to the solid-state image sensor 120 facing via the cavity 151, and blocks the entry of dirt and water vapor from the outside into the cavity 151 in cooperation with the interposer substrate 150. Note that, in consideration of convenience in using the solid-state image sensor 120, an optical filter film that lets through light with a specific wavelength may be formed on the surface of the lid member 170. Furthermore, moreover, the surface of the lid member 170 may be coated with an opponent prevention film that prevents reflection from the inside and outside of the cavity 151.

The mounting substrate 180 will be described. The mounting substrate 180 is a substrate on which a circuit for driving the solid-state image sensor 120, a chip set for driving, and the like are mounted. The mounting substrate 180 is provided with a land jointed to the signal transmission solder balls 160, and a land connected to heat release solder balls 195 to be described later. Furthermore, when a direction toward the light reception surface is assumed to be an upper direction, a via for heat release is provided below the lands as necessary. This is determined depending on the substrate structure of the chip set.

An opening 191 will be described. The opening 191 is formed in the center part of the rear surface of the semiconductor substrate 110 by performing etching onto a silicon substrate. In the diagram, a cross-sectional shape of the opening 191 is a trapezoid having an upper side corresponding to a light reception side. The semiconductor substrate 110 is thinned by the etching. The solid-state image sensor 120 is provided in the center part of the semiconductor substrate 110, and heat is generated during the operation of the solid-state image sensor 120. By thinning the heat generation point, a distance to the heat release solder balls 195 to be described later becomes shorter, and heat capacity of the semiconductor substrate 110 itself can be reduced. Moreover, the volume of the heat release solder balls 195 can be increased by an amount corresponding to the volume of the semiconductor substrate 110 that has been reduced by etching. These functions contribute to the reduction in thermal resistance of the entire fan-out package 100, and heat release characteristics of the semiconductor substrate 110 are enhanced.

Furthermore, by performing etching, the height of the semiconductor substrate 110 can be maintained at the same height as the height set in a case where the heat release solder balls 195 are not provided. Such unchanging height becomes an advantageous feature especially in a thin set such as a smartphone in which the height of a semiconductor package greatly influences the thickness of the product itself that uses the semiconductor package.

For forming the opening 191, wet etching or the like is used. For example, anisotropic etching generally used in a manufacturing process of Micro Electro Mechanical Systems (MEMS) can be applied. In the anisotropic etching, etching is performed by forming a desired opening pattern on the rear surface of the silicon semiconductor substrate 110 using an alkali-resistant resist or the like, and the silicon semiconductor substrate 110 is immersed in strong alkaline solution such as potassium hydroxide using the pattern as a mask, for example. Then, in the anisotropic etching, an opening shape is uniquely determined on the basis of the crystalline orientation of the used semiconductor substrate 110. Normally, in semiconductors including solid-state image sensors, a monocrystalline silicon substrate having a surface orientation (1,0,0) is often used. In this case, if a rectangular oxidized film or a nitride film, or an opening mask of a resist is formed on the rear surface of silicon, the opening 191 with an etching shape having an inclination at about 55 degrees, and gradually deepening in a depth direction when the depth direction corresponds to a direction toward the light reception surface is formed. The depth of the etching (in other words, the thickness of the center part of the semiconductor substrate 110) can be adjusted highly accurately by finely controlling a time of the etching, the temperature of etching solution, and moreover, a holding or swinging method of the semiconductor substrate 110 in an etching device, or the like.

Furthermore, by employing a frame structure without thinning the periphery, as compared with a case where the entire semiconductor substrate 110 is simply thinned, the can be maintained also as a structure, and an original external size can be kept. Moreover, also in a formation process of the stud bump 130 that is performed in a manufacturing process to be described later, an under portion of the pad 132 is not thinned, and the thickness is ensured. Thus, ultrasonic vibration necessary for the process can be applied without problems.

An insulating layer 192 will be described. The opening 191 is covered with the insulating layer 192. By the opening 191, silicon of the rear surface of the semiconductor substrate 110 is exposed immediately after etching, and the heat release solder balls 195 bring the rear surface into direct contact with the mounting substrate 180. The rear surface is not always surely in an electrically-floating state, and if the rear surface is electrically connected with the mounting substrate 180, the solid-state image sensor 120 becomes susceptible to leak current of an external circuit thereof and noise from the outside. Thus, the rear surface is desirably insulated by the insulating layer 192. However, for enhancing heat release characteristics, it is necessary to obtain good thermal conductivity of the insulating layer 192. Thus, for example, ceramic with high thermal conductivity is used as the material of the insulating layer 192. For example, material with a thermal conductivity of 27 watts per millikelvin (W/mK) is used. As ceramic, for example, silicon carbide or alumina is used. A thermal conductivity of silicon carbide is 264 watts per millikelvin (W/mK), for example. Coating methods of the insulating layer 192 include physical vapor deposition (PVD), for example. Note that chemical vapor deposition (CVD) can also be used in place of the PVD.

A metal layer 193 will be described. The shape of the metal layer 193 is a thin film shape when viewed from the X direction or the Y direction, and the insulating layer 192 is covered with the metal layer 193. The material of the metal layer 193 is copper, for example. In view of recent environmental problems, lead-free ternary metal including tin, silver, and copper is used as the material of general solder. While the insulating layer 192 including ceramic or the like has low a soldering property, copper especially in the metal layer 193 easily forms an alloy with tin in solder (i.e., has a high soldering property). Thus, by using copper as the material of the metal layer 193, higher joint strength with solder can be obtained as compared with other types of metal. Moreover, because copper itself has a relatively high thermal conductivity of 400 watts per millikelvin (W/mK), it is desirable to use copper also from the perspective of enhancement in heat release characteristics. Furthermore, because copper can be formed relatively easily using a manufacturing method that uses the PVD generally used in a semiconductor process, copper is preferable.

For exhibiting a heat release effect, it is desirable that the metal layer 193 is in a planar state when viewed from the Z direction. Note that, if a sufficient heat release effect can be obtained, it is also possible to form the metal layer 193 in a wire shape with a line width of several tens micrometer to several hundreds micrometer when viewed from the Z direction.

A solder mask 194 will be described. The solder mask 194 is resin for defining a mounting point of the heat release solder balls 195. As the solder mask 194, for example, photosensitive epoxy resin having a heat resistance property and a high insulation property is used. By using photosensitive epoxy resin, by a process of a photoresist or the like, it is possible to easily form an opening with the metal layer 193 exposed at a mounting point of the heat release solder balls 195. Furthermore, in a case where the metal layer 193 has a linear shape, by surely covering a space between wires with the solder mask 194, it is possible to prevent a short circuit between wires that is caused by a conductive foreign substance. Furthermore, by restricting an opening of the solder mask 194 to only a mounting point of the heat release solder balls 195, it is possible to define a junction area of the metal layer 193 and the heat release solder balls 195, and prevent a short circuit between the adjacent heat release solder balls 195. Furthermore, for example, so-called "negative type" photosensitive material is used as the solder mask 194. In the negative type, a portion (i.e., an opening of a photomask) to be irradiated with exposure light through the photomask after application of liquid resin have insolubility in developing solution in a subsequent development process. Note that, in place of the negative type, "positive type" photosensitive material having characteristics opposite to the negative type can also be used as the solder mask 194. Furthermore, for adjusting a linear expansion coefficient of material, the solder mask 194 may contain a filler such as silica.

The heat release solder balls 195 will be described. The heat release solder balls 195 are ball-shaped solder members. The plurality of heat release solder balls 195 is disposed in the fan-out package 100, and these heat release solder balls 195 joint the exposed metal layer 193 and the mounting substrate 180. Furthermore, the heat release solder balls 195 are used as a route for releasing heat generated in the solid-state image sensor 120, to the mounting substrate 180, and are not used for the transmission of an electrical signal such as a pixel signal. On the other hand, the signal transmission solder balls 160 are used for the transmission of an electrical signal. Furthermore, because it is necessary to dispose a narrow space between the semiconductor substrate 110 and the mounting substrate 180, a size in the Z direction of the heat release solder balls 195 is smaller than a size in the Z direction of the signal transmission solder balls 160. The material of the heat release solder balls 195 is ternary metal similarly to the signal transmission solder balls 160, for example. Note that, if a reflow profile (for example, temperature curve in reflow) being a jointing process with the mounting substrate 180 is the same, an alloy ratio, constituent metal, or the like of the heat release solder balls 195 can be changed to that different from the signal transmission solder balls 160, with emphasis on a heat release property.

Note that, as described above, the heat release solder balls 195 are used only for heat release and not used for signal transmission, but the heat release solder balls 195 can be used for both of heat release and signal transmission. In this case, for example, it is sufficient that a through-silicon via (TSV) penetrating from the pad 132 of the semiconductor substrate 110 to the rear surface is formed, and the TSV is connected to the metal layer 193. Therefore, the metal layer 193 and the heat release solder balls 195 can be used as a wire for transmitting a pixel signal or a drive signal, or a wire of a power source or ground.

Furthermore, the semiconductor substrate 110 on which the solid-state image sensor 120 is formed is used in the fan-out package 100, but the configuration is not limited to this configuration. The semiconductor substrate 110 on which a semiconductor integrated circuit other than the solid-state image sensor 120 is formed can also be used.

Furthermore, the semiconductor substrate 110 and the interposer substrate 150 are mounted on the mounting substrate 180, but are sometimes shipped in a state of being unmounted on the mounting substrate 180. In this case, a portion (the semiconductor substrate 110, the interposer substrate 150, or the like) other than the mounting substrate 180 in the diagram is treated as the fan-out package 100.

If the above-described configuration is summarized, out of the both surfaces of the semiconductor substrate 110, the pad 132 is provided on the light reception surface and the opening 191 is formed on the rear surface. The opening 191 on the rear surface is covered with the insulating layer 192, and the insulating layer 192 is covered with the metal layer 193. Furthermore, the interposer wire 152 connected to the pad 132 via the stud bump 130 is formed on the interposer substrate 150. Furthermore, the signal transmission solder balls 160 are jointed to the interposer wire 152 and the mounting substrate 180, and transmit a predetermined electrical signal. On the other hand, the plurality of heat release solder balls 195 is jointed to the metal layer 193 and the mounting substrate 180. Note that, the heat release solder balls 195 correspond to an example of a solder member described in the appended claims.

Furthermore, the material of the insulating layer 192 is ceramic, for example. Examples of ceramic include alumina and silicon carbide. Furthermore, the material of the metal layer 193 desirably contains copper.

Furthermore, the lid member 170 is connected to the interposer substrate 150, and the solid-state image sensor 120 is formed on the semiconductor substrate 110.

Here, a comparative example in which the heat release solder balls 195 are not provided will be assumed. In this comparative example, the opening 191 is unnecessary, and an opening 151, the insulating layer 192, and the metal layer 193 are unnecessary as well. In this configuration, a slight clearance is provided between a semiconductor substrate and a mounting substrate. This is provided for preventing the semiconductor substrate from being damaged by the rear surface of the semiconductor substrate and the mounting substrate scraping against each other due to a difference in linear expansion coefficient between the semiconductor substrate and the mounting substrate. Also in a case where a clearance is provided in this manner, heat can be released from the semiconductor substrate to the mounting substrate via signal transmission solder balls, but in a case where a heat release amount of the semiconductor substrate is large, an amount of heat release sometimes becomes insufficient only by the solder balls. Furthermore, heat can be released by filling the clearance with resin as underfill resin, but because a thermal conductivity of resin is not so high, it is difficult to sufficiently reduce thermal resistance.

In contrast to this, in the configuration in the diagram in which the plurality of heat release solder balls 195 is provided in a clearance, these heat release solder balls 195 release heat generated in the solid-state image sensor 120, to the mounting substrate 180. Therefore, as compared with the comparative example, thermal resistance of the semiconductor substrate 110 can be reduced.

Figure 2A:
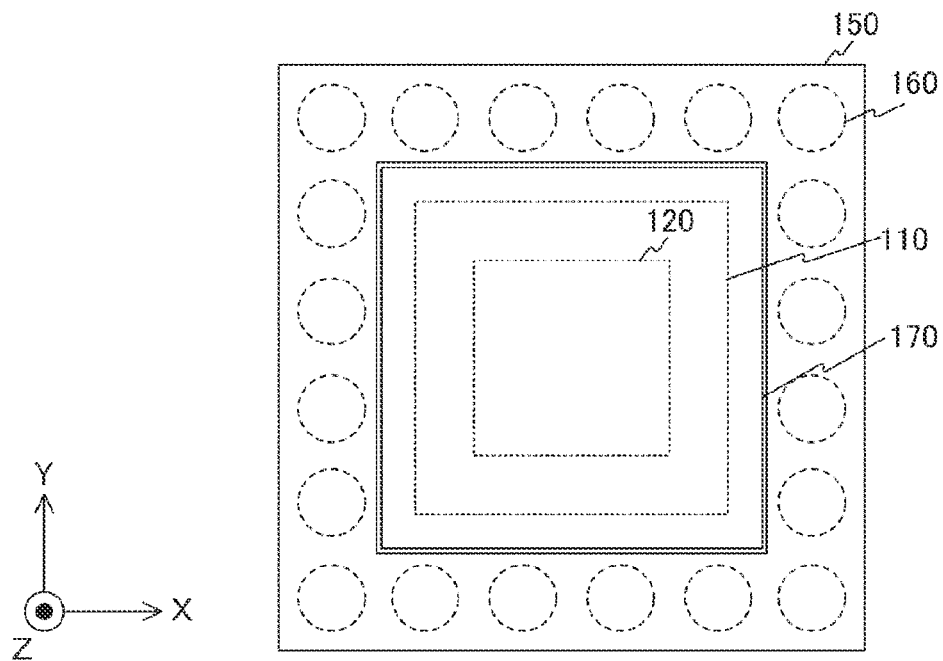
FIGS. 2A and 2B are plan views illustrating one configuration example of a fan-out package according to the first embodiment of the present technology.
Figure 2B:
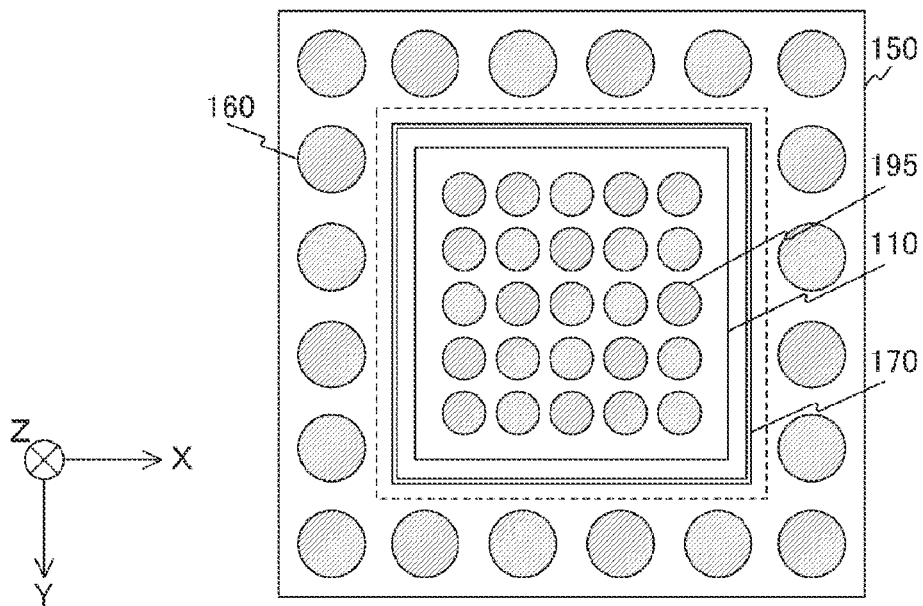

FIGS. 2A and 2B are plan views illustrating one configuration example of the fan-out package 100 according to the first embodiment of the present technology. In the diagram, FIG. 2A illustrates a top view of the fan-out package 100 viewed from the light reception side. In the diagram, FIG. 2B illustrates a plan view of a plane passing through a line segment X1-X2 in FIG. 1, and being parallel to the light reception surface, viewed from the rear surface side. In other words, FIG. 2B illustrates a bottom view of the fan-out package 100 before the fan-out package 100 is mounted on the mounting substrate 180.

As exemplified in FIG. 2A, the signal transmission solder balls 160 are arrayed in the X direction and the Y direction of the periphery of the interposer substrate 150. Furthermore, the semiconductor substrate 110 is disposed in the center part of the interposer substrate 150. By the interposer substrate 150, a signal line connected to the stud bump 130 of the semiconductor substrate 110 is wired in a shape spreading like a fan.

Furthermore, as exemplified in FIG. 2B in the diagram, the plurality of heat release solder balls 195 is arrayed on the rear surface of the semiconductor substrate 110 together with the signal transmission solder balls 160.

[Example of Manufacturing Method of Semiconductor Package]

Figure 3A:
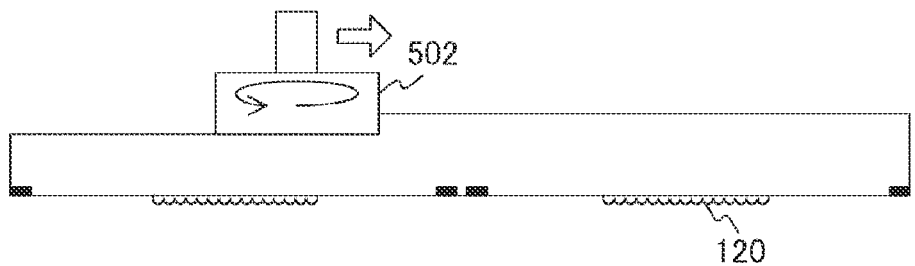
FIGS. 3A, 3B, 3C, 3D, and 3E are diagrams for describing a manufacturing process up to patterning of an insulating layer according to the first embodiment of the present technology.
Figure 3B:
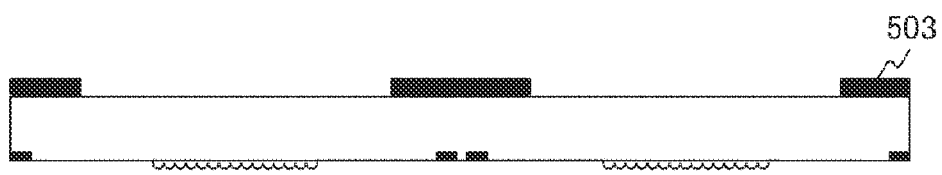
Figure 3C:
Figure 3D:
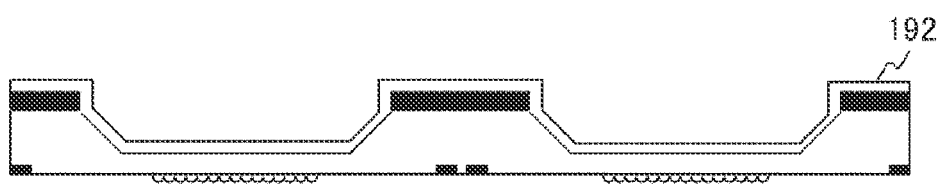
Figure 3E:
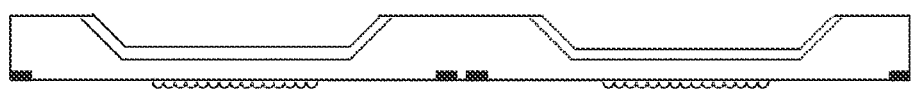

FIGS. 3A, 3B, 3C, 3D, and 3E are diagrams for describing a manufacturing process up to patterning of an insulating layer according to the first embodiment of the present technology. In the diagram, FIG. 3A is a diagram for describing a polishing process. In the diagram, FIG. 3B is a diagram for describing an application process of an alkali-proof resist 503. In the diagram, FIG. 3C is a diagram for describing a process of anisotropic etching. In the diagram, FIG. 3D is a diagram for describing a coating process of the insulating layer 192. In the diagram, FIG. 3E is a diagram for describing a patterning process of the insulating layer 192.

First of all, a silicon wafer on which the solid-state image sensor 120 is formed is prepared. The wafer has been subjected to various processes (not illustrated) for forming the solid-state image sensor 120 on the rear surface (i.e., the above-described light reception surface). In recent years, an eight-inch wafer or a twelve-inch wafer is mainly used. A protection sheet is attached to the surface of the completed wafer. Normally, various thin films generated in various processes performed so far are stacked on the rear surface of the wafer. Furthermore, fine damages and dirt are often attached to the rear surface by handling during processes. In many cases, it is necessary to once expose an original silicon surface and remove these. Furthermore, in recent years, there has been an increasing demand for thinner and compact smartphones and digital cameras, and it is necessary to thin a sensor device itself as far as possible. Thus, a manufacturing system attaches a protection sheet to the entire rear surface of a wafer using equipment such as a laminating device. The protection sheet is attached for performing Back-Grinding-Remove (BGR) process of grinding a rear surface of silicon in a wafer state up to a desired thickness, and for subsequently protecting the surface of the wafer on which pixels are formed, from handling. Note that a tape attached at this time may be a type of any type of a tape of a type with adhesive strength to be weakened by being irradiated with ultraviolet for detachment, a tape of a type with adhesive strength to be weakened by being heated, and a tape of another type. Furthermore, for further increasing a surface roughness degree of the surface after the BGR process, a "mirror finish" process such as chemical polish or dry polish may be added.

As exemplified in FIG. 2A in the diagram, the manufacturing system polishes the rear surface up to a desired thickness using a polishing device 502, with the surface of the protection sheet facing downward. In this manner, a process of polishing the rear surface is called a Back Ground Remove (BGR).

As exemplified in FIG. 2B in the diagram, the manufacturing system forms the alkali-proof resist 503 on the surface of the silicon wafer thinned to the desired thickness by the process of BGR. In the process, the manufacturing system applies a resist bearable with "anisotropic etching" on silicon being a next process, to the wafer rear surface of which silicon is exposed by the BGR, as the alkali-proof resist 503. The manufacturing system applies the alkali-proof resist 503 to the wafer rear surface as uniformly as possible using a spin-coating method or the like, for example. After that, the manufacturing system exposes the alkali-proof resist 503 using a photomask, and opens a portion desired to be subjected to anisotropic etching, by development and patterning.

As exemplified in FIG. 2C in the diagram, the manufacturing system performs anisotropic etching on the silicon in the opening patterned in the preceding process, using strong alkaline solution such as potassium hydroxide. Note that ammonium hydroxide solution or the like may be used in place of potassium hydroxide solution. In a case where anisotropic etching is performed on a silicon substrate having a plane direction (1, 0, 0) that is widely used in image sensors and LSI manufacturing, anisotropic etching of the (1, 0, 0) surface is advanced in such a manner that the (1, 1, 1) surface having an angle of about 55 degrees with respect to the end surface in a planar direction is exposed. Thus, an etching shape with a large opening is formed on the rear surface side of the wafer. Furthermore, in the etching using potassium hydroxide, the manufacturing system puts the wafer into potassium hydroxide solution heated to around approximately 80° C., using a so-called batch-type wet etching device that collectively processes a plurality of wafers.

Then, the manufacturing system performs etching over a predetermined etching time while rotating and swinging in such a manner that etching becomes uniform throughout the wafer surface. Note that, as for the depth of etching, a desired depth can be controlled on the basis of an etching time by preliminarily checking an etching rate using a similar wafer. By accurately controlling the etching time and the temperature of potassium hydroxide solution, it is possible to keep at a fixed etching amount. As a matter of course, washing and Quick-Dump-Rinse (QDR) can be executed after etching using potassium hydroxide.

In the process of the anisotropic etching, if the protection sheet used in the BGR of the preceding process is resistant to potassium hydroxide, the protection sheet may be used as-is. Furthermore, the manufacturing system may newly attach another protection sheet suitable for an anisotropic etching process.

Then, as exemplified in FIG. 2D in the diagram, the manufacturing system coats the entire wafer rear surface with the insulating layer 192 over the silicon surface opened by anisotropic etching in the preceding process. As the material of the insulating layer 192, ceramics or the like that has a relatively good thermal conductivity and a moderate insulation property is preferably used. The CVD or the PVD is used as a film formation method. Note that a film is formed in a state in which the alkali-proof resist 503 is left as-is.

As exemplified in FIG. 2E in the diagram, the manufacturing system lifts off the alkali-proof resist 503 together with the insulating layer 192 formed thereon, for leaving a film of the insulating layer 192 that has been formed in the preceding process, only in a portion opened by etching. At this time, for easily detaching the alkali-proof resist 503, the manufacturing system performs removal using dedicated detachment agent or the like, but may perform rinse after the lift-off using organic solvent or pure water for avoiding residue.

Figure 4A:
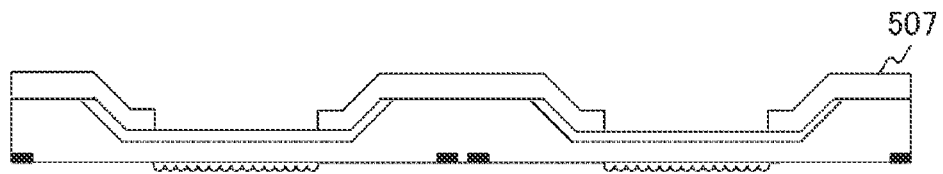
FIGS. 4A, 4B, 4C, 4D, and 4E are diagrams for describing a manufacturing process up to dicing according to the first embodiment of the present technology.
Figure 4B:
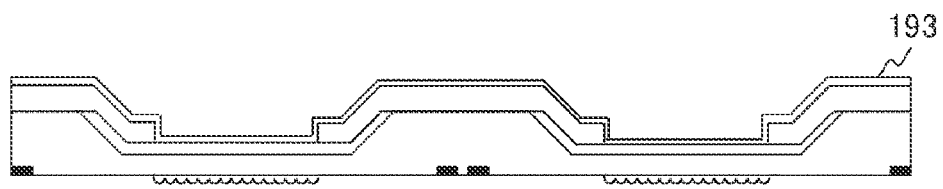
Figure 4C:
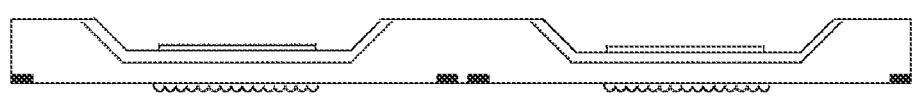
Figure 4D:
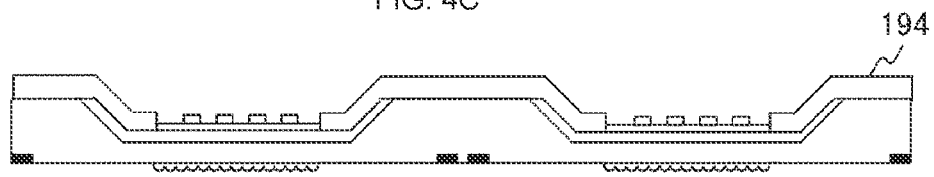
Figure 4E:
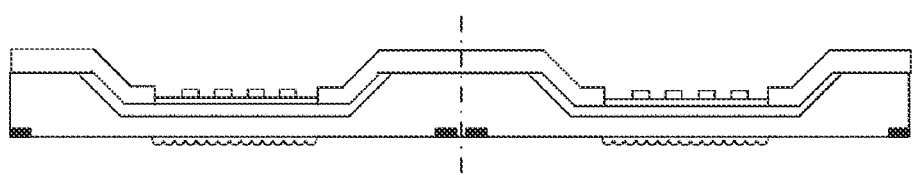

FIGS. 4A, 4B, 4C, 4D, and 4E are diagrams for describing a manufacturing process up to dicing according to the first embodiment of the present technology. In the diagram, FIG. 4A is a diagram for describing an application process of a coated lift-off resist 507. In the diagram, FIG. 4B is a diagram for describing a coating process of the metal layer 193. In the diagram, FIG. 4C is a diagram for describing a patterning process of the metal layer 193. In the diagram, FIG. 4D is a diagram for describing a patterning process of the solder mask 194. In the diagram, FIG. 4E is a diagram for describing a process of dicing.

The next process is an upstream process for forming the metal layer 193. Before forming the metal layer 193, as exemplified in FIG. 4A in the diagram, the manufacturing system performs patterning using the coated lift-off resist 507 for the purpose of defining a formation portion of the metal layer 193. As the material of the coated lift-off resist 507, it is necessary to use material bearable with a subsequent film formation process. Nevertheless, because a portion to which a resist is to be applied has a recessed shape formed by silicon anisotropic etching in the preceding process, unlike the alkali-proof resist 503, a spray-coating method having good coating coverage for surface unevenness can be preferably used. Note that, after the coating of the coated lift-off resist 507, the manufacturing system forms a desired pattern by performing resist baking, exposure that uses a mask, and development patterning that uses predetermined developing solution. Furthermore, a lift-off dedicated resist that can be formed into an "inverse tapered shape" can also be used as the coated lift-off resist 507 in such a manner that lift-off being a subsequent process can be easily performed.

Next, a process of forming the metal layer 193 will be described. As exemplified in FIG. 4B in the diagram, the manufacturing system forms the metal layer 193 having a length of about two micrometers on the wafer on which a desired pattern is preliminarily formed by the coated lift-off resist 507, over the wafer entire surface by the PVD. The temperature set at the time of the film formation is preferably low as far as possible for avoiding transubstantiation of the coated lift-off resist 507. If possible, the temperature is preferably equal to or lower than 100° C.

As exemplified in FIG. 4C in the diagram, the manufacturing system lifts off the coated lift-off resist 507 patterned earlier, together with a film of the metal layer 193 that has been formed on the resist. At this time, for easily detaching the coated lift-off resist 507, the manufacturing system performs removal using dedicated detachment agent or the like, but may perform rinse after the lift-off using organic solvent or pure water for avoiding residue. By the process, the metal layer 193 is patterned into a desired pattern relatively easily.

As exemplified in FIG. 4D in the diagram, the manufacturing system applies the solder mask 194 onto the metal layer 193 formed in the preceding process. At this time, because a portion to which the solder mask 194 is to be applied has a recessed shape formed by silicon anisotropic etching, a spray-coating method having good coating coverage for surface unevenness can be preferably used. Note that, after the coating of the solder mask 194, the manufacturing system forms a desired pattern by performing resist baking, exposure that uses a mask, and development patterning that uses predetermined developing solution. Here, a pattern having a land shape for mounting the heat release solder balls 195 is formed. For example, so-called "negative type" photosensitive material is used as the solder mask 194. Note that, in place of the negative type, "positive type" photosensitive material can also be used as the solder mask 194. Furthermore, the solder mask 194 may contain a filler such as silica.

After the above-described various processes, as exemplified in FIG. 4E in the diagram, the manufacturing system finally singulates a wafer having the rear surface on which a land is formed. As for singulation, the wafer is singulated by being cut at a boundary portion (so-called scribe line portion) of a chip that becomes the semiconductor substrate 110, using a dicing device.

Figure 5A:
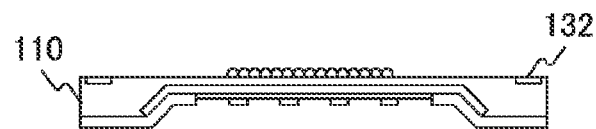
FIGS. 5A, 5B, 5O, 5D, and 5E are diagrams for describing a manufacturing process up to attachment of a lid member according to the first embodiment of the present technology.
Figure 5B:
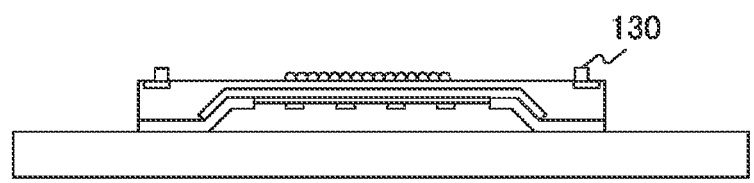
Figure 5C:
Figure 5D:
Figure 5E:
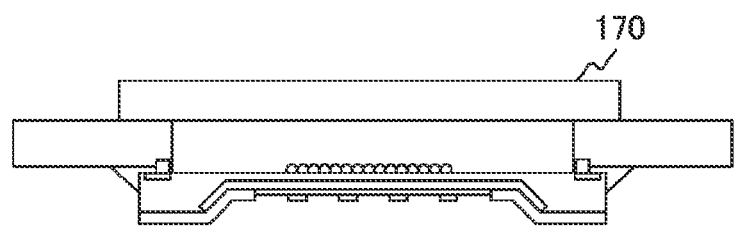

FIGS. 5A, 5B, 5O, 5D, and 5E are diagrams for describing a manufacturing process up to attachment of the lid member 170 according to the first embodiment of the present technology. In the diagram, FIG. 5A is a diagram illustrating an example of the semiconductor substrate 110 after singulation. In the diagram, FIG. 5B is a diagram for describing a process of formation of the stud bump 130. In the diagram, FIG. 5C is a diagram for describing a connection process of the interposer substrate 150. In the diagram, FIG. 5D is a diagram for describing a process of sealing. In the diagram, FIG. 5E is a diagram for describing a process of attachment of the lid member 170.

The manufacturing system picks up the singulated semiconductor substrate 110, and as exemplified in FIG. 5A in the diagram, and performs preparation for stud bump bonding by arranging the semiconductor substrate 110 on a seating of equipment, a protection tap, or the like. Whether to place the semiconductor substrate 110 on the seating of bonding equipment, or arrange the semiconductor substrate 110 on the protection tape and process the semiconductor substrate 110 together with the protection tape varies depending on the equipment to be used.

As exemplified in FIG. 5B in the diagram, the manufacturing system bonds the gold stud bump 130 onto the pad 132 of the semiconductor substrate 110 in dedicated equipment. As a method of bonding, a method of forming the stud bump 130 onto the pad 132 using ultrasonic waves similarly to wire bonding is generally used. Note that, in a case where the height of the stud bump 130 is required, it is possible to erect a second bump onto a stud bump erected first, in an overlapped manner. In a case where surface flatness of the stud bump 130 is required, after the formation of the stud bump 130, a process called "stamping" for crushing the bump can also be added.

Next, as exemplified in FIG. 5C in the diagram, the manufacturing system bonds the semiconductor substrate 110 to the separately-prepared interposer substrate 150. An opening conforming to the size of a pixel is provided in the center part (i.e., a point in which the semiconductor substrate 110 is mounted) of the interposer substrate 150. A pad and a land (not illustrated) on an interposer side are provided in a location near the opening that faces the stud bump 130. The land is connected to the signal transmission solder balls 160 through the interposer wire 152.

For ensuring a joint property of the stud bump 130 and forming the cavity 151, as exemplified in FIG. 5D in the diagram, the manufacturing system applies the seal resin 140 to the vicinity of an outer periphery of the semiconductor substrate 110, and performs sealing. By the seal resin 140, it becomes possible to separate the light reception surface of the solid-state image sensor 120 located inside the cavity 151, from the outside, and prevent the entry of dirt into the cavity 151 from the outside, or the like.

Next, as exemplified in FIG. 5E in the diagram, the manufacturing system attaches the lid member 170 to the interposer substrate 150 using a glass binder. As the glass binder, normally, an epoxy resin glass binder such as ultraviolet curable resin, thermoset resin, or cold curable resin, or an acrylic resin glass binder can be preferably used. Note that resin having close physicality to these resins can also be used as a glass binder.

Figure 6A:
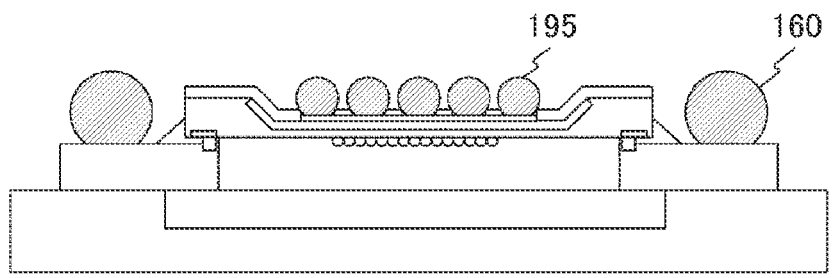
FIGS. 6A, 6B, and 6C are diagram for describing a manufacturing process up to substrate mounting according to the first embodiment of the present technology.
Figure 6B:
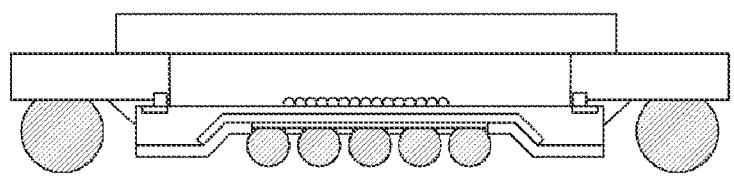
Figure 6C:
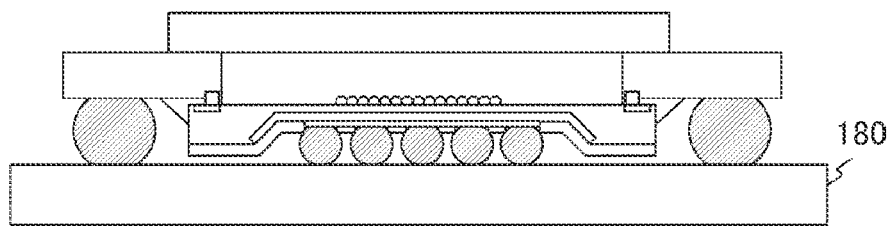

FIGS. 6A, 6B, and 6C are diagrams for describing a manufacturing process up to substrate mounting according to the first embodiment of the present technology. In the diagram, FIG. 6A is a diagram for describing a process of reflow. In the diagram, FIG. 6B is a cross-sectional view illustrating a state at the end of packaging. In the diagram, FIG. 6C is a diagram for describing a process of substrate mounting.

The manufacturing system attaches a protection tape for protecting the surface of the lid member 170. Surface protection of the lid member 170 is required because damages and dirt attached to the surface during a process flow cause a decline in image capturing image quality of the solid-state image sensor 120. In particular, in this process, because handling needs to be performed in a state in which the lid member 170 is oriented downward, at the time of reflow of solder balls, by the protection tape, it is possible to simultaneously prevent pollution of the surface of the lid member 170 caused by various types of outgas in the atmosphere of a reflow furnace.

In a state in which the protection tape is attached, as exemplified in FIG. 6A in the diagram, the manufacturing system mounts the signal transmission solder balls 160 and the heat release solder balls 195 at predetermined positions of the interposer substrate 150 and the semiconductor substrate 110. Before the mounting, a flux (not illustrated) is preliminarily applied to a mounting portion. After mounting these solder balls, the manufacturing system performs reflow in the reflow furnace, and joints these solder balls.

As exemplified in FIG. 6B in the diagram, the manufacturing system detaches the protection tape in a state in which the solder ball side is oriented downward.

As exemplified in FIG. 6C in the diagram, the manufacturing system performs reflow mounting onto the mounting substrate 180 similarly to other mounted components. A multilayer substrate is generally used as the mounting substrate 180. Nevertheless, the number of layers and a layer configuration are determined on the basis of the convenience of a set to be used. In particular, as for an internal configuration of the mounting substrate 180, it is sufficient that inner layer wiring that considers a heat release route is performed, and the internal configuration is determined on the basis of the convenience on the set side on which a fan-out package is to be used.

Figure 7:
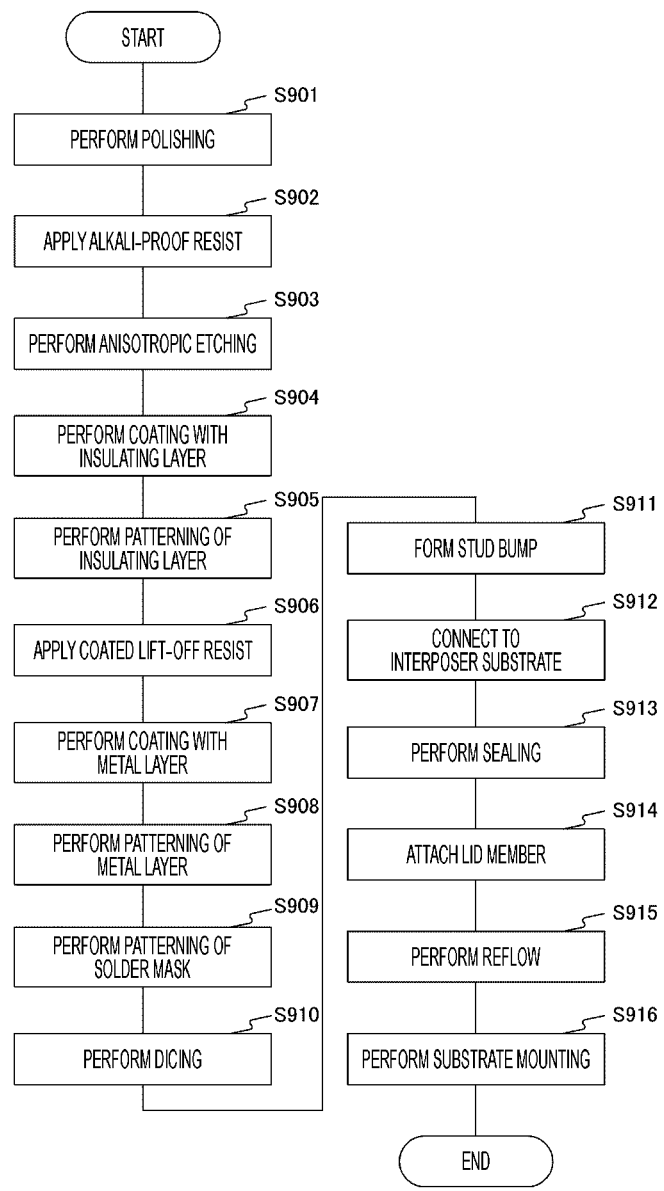
FIG. 7 is a flowchart illustrating an example of a manufacturing process according to the first embodiment of the present technology.

FIG. 7 is a flowchart illustrating an example of a manufacturing process according to the first embodiment of the present technology. The manufacturing system polishes the rear surface of a wafer up to a desired thickness (Step S901), and applies the alkali-proof resist 503 (Step S902). The manufacturing system performs anisotropic etching (Step S903), and performs coating with the insulating layer 192 (Step S904).

Then, the manufacturing system performs patterning of the insulating layer 192 (Step S905), and applies the coated lift-off resist 507 (Step S906). The manufacturing system performs coating with the metal layer 193 (Step S907), and performs patterning thereof (Step S908). The manufacturing system performs application and patterning of the solder mask 194 (Step S909), and performs dicing and singulation (Step S910).

Subsequently, the manufacturing system forms the stud bump 130 onto the pad 132 (Step S911), and connects the interposer wire 152 of the interposer substrate 150 with the stud bump 130 (Step S912). The manufacturing system seals the periphery of the stud bump 130 using the seal resin 140 (Step S913), and attaches the lid member 170 (Step S914).

By reflow, the manufacturing system joints the signal transmission solder balls 160 and the heat release solder balls 195 with the interposer substrate 150 and the semiconductor substrate 110 (Step S915), and performs mounting to the mounting substrate 180 (Step S916).

In this manner, according to the first embodiment of the present technology, because the heat release solder balls 195 that joint the semiconductor substrate 110 and the mounting substrate 180 are provided, heat of the semiconductor substrate 110 can be released to the mounting substrate 180 via the heat release solder balls 195. Therefore, as compared with a case where the heat release solder balls 195 are not provided, it is possible to reduce an amount of rise in temperature (i.e., thermal resistance) per unit time of the semiconductor substrate 110.

2. Second Embodiment

In the above-described first embodiment, the plurality of heat release solder balls 195 is arranged between the semiconductor substrate 110 and the mounting substrate 180. However, if a heat release amount of the semiconductor substrate 110 is large, in some cases, a junction area of these heat release solder balls 195 becomes insufficient, and thermal resistance cannot be sufficiently reduced. A fan-out package 100 of the second embodiment is different from that of the first embodiment in that solder is formed in a plate shape and a junction area is widened.

Figure 8:
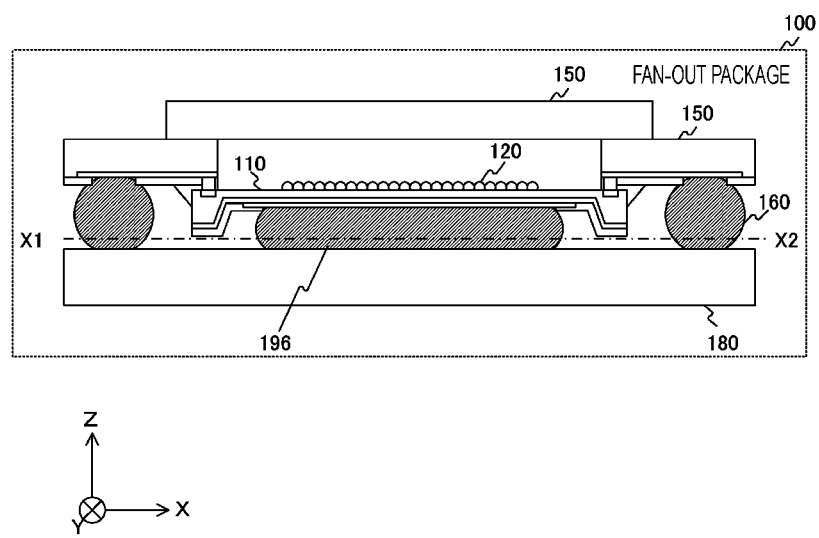
FIG. 8 is a cross-sectional view illustrating one configuration example of a fan-out package according to a second embodiment of the present technology.

FIG. 8 is a cross-sectional view illustrating one configuration example of the fan-out package 100 according to the second embodiment of the present technology. The second fan-out package 100 is different from that of the first embodiment in that a plate-shaped solder member is disposed as a surface solder 196 in place of the plurality of heat release solder balls 195. Note that the surface solder 196 is an example of a solder member described in the appended claims.

Here, the "plate shape" means a shape in which a size (thickness) of the surface solder 196 in the Z direction vertical to the light reception surface is smaller than sizes of the surface solder 196 in the X direction and the Y direction.

Unlike the first embodiment, the solder mask 194 of the second embodiment has a shape in which an opening of the surface solder 196 is large and integrated for connecting the entire surface solder 196.

The surface solder 196 will be described. Normally, solder becomes a spherical shape by surface tension of itself at the time of melting. However, if a joint surface (here, an opening of the solder mask 194) is wide, solder can be formed into a plate shape by adjusting the solder amount to the volume to such an extent that solder is not formed into a spherical shape. By using the plate-shaped surface solder 196, it is possible to ensure a wider junction area than the first embodiment in which the heat release solder balls 195 are used. Therefore, an amount of heat release can be increased.

Figure 9:
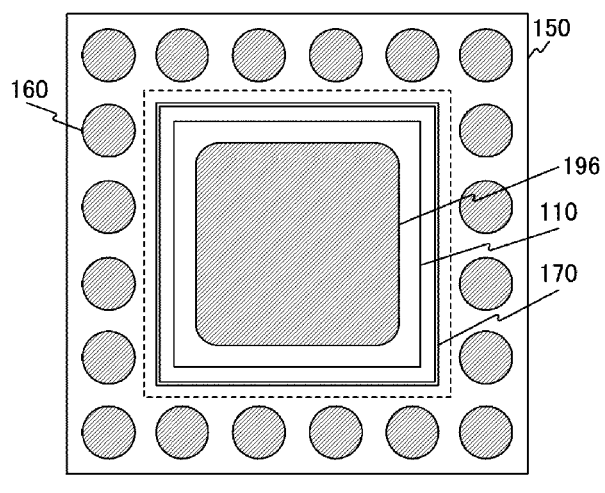
FIG. 9 is a plan view illustrating one configuration example of a fan-out package according to the second embodiment of the present technology.
Figure 9:
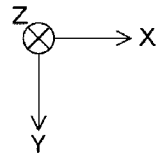

FIG. 9 is a plan view illustrating one configuration example of the fan-out package 100 according to the second embodiment of the present technology. Note that a top view of the fan-out package 100 of the second embodiment is similar to that of the first embodiment.

As exemplified in the diagram, a junction area of the surface solder 196 of the second embodiment is wider than a total of the respective junction areas of the plurality of heat release solder balls 195 of the first embodiment exemplified in FIGS. 2A and 2B.

Furthermore, among processes up to dicing of the second embodiment, processes up to a process of patterning of the metal layer 193 are similar to those of the first embodiment. That is, the processes exemplified in FIGS. 3A, 3B, 3C, 3D, and 3E and the processes of FIGS. 4A, 4B, and 4C in the first embodiment are similar to those of the second embodiment. Hereinafter, processes different from the first embodiment will be described.

Figure 10A:
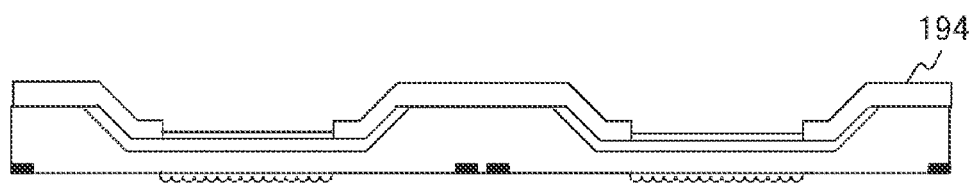
FIGS. 10A and 10B are diagrams for describing a manufacturing process up to dicing according to the second embodiment of the present technology.
Figure 10B:
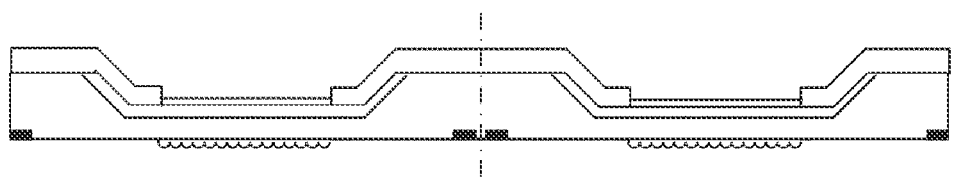

FIGS. 10A and 10B are diagrams for describing a manufacturing process up to dicing according to the second embodiment of the present technology. In the diagram, FIG. 10A is a diagram for describing a patterning process of the solder mask 194. In the diagram, FIG. 10B is a diagram for describing a process of dicing.

As exemplified in FIG. 10A in the diagram, the manufacturing system applies the solder mask 194 onto the metal layer 193 formed in the preceding process. For example, a spray-coating method can be preferably used. Note that, after the coating of the solder mask 194, the manufacturing system forms a desired pattern by performing resist baking, exposure that uses a mask, and development patterning that uses predetermined developing solution. Here, for mounting the surface solder 196, a pattern having a land shape with a wide area is formed. For example, so-called "negative type" photosensitive material is used as the solder mask 194. Note that, in place of the negative type, "positive type" photosensitive material can also be used as the solder mask 194. Furthermore, the solder mask 194 may contain a filler such as silica. Then, as exemplified in FIG. 10B in the diagram, the manufacturing system finally singulates a wafer having the rear surface on which a land is formed.

Figure 11A:
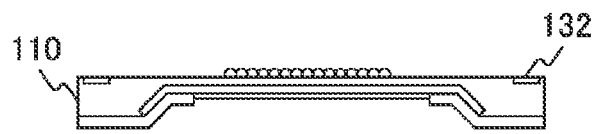
FIGS. 11A, 11B, 11C, 11D, and 11E are diagrams for describing a manufacturing process up to attachment of a lid member according to the second embodiment of the present technology.
Figure 11B:
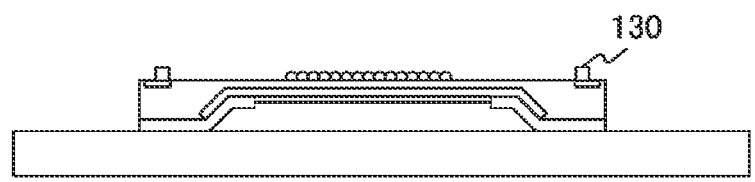
Figure 11C:
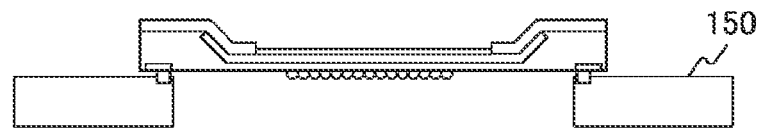
Figure 11D:
Figure 11E:
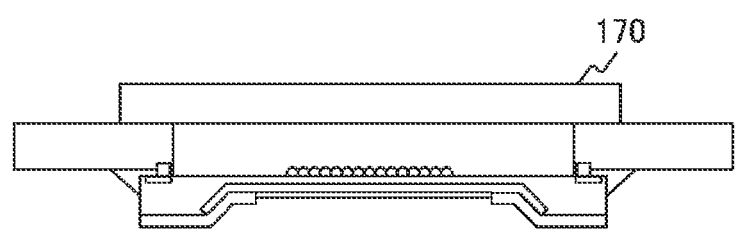

FIGS. 11A, 11B, 11C, 11D, and 11E are diagrams for describing a manufacturing process up to attachment of the lid member 170 according to the second embodiment of the present technology. In the diagram, FIG. 11A is a diagram illustrating an example of the semiconductor substrate 110 after singulation. In the diagram, FIG. 11B is a diagram for describing a process of formation of the stud bump 130. In the diagram, FIG. 11C is a diagram for describing a connection process of the interposer substrate 150. In the diagram, FIG. 11D is a diagram for describing a process of sealing. In the diagram, FIG. 11E is a diagram for describing a process of attachment of the lid member 170. The processes of the second embodiment exemplified in the diagram are similar to corresponding processes of the first embodiment.

Figure 12A:
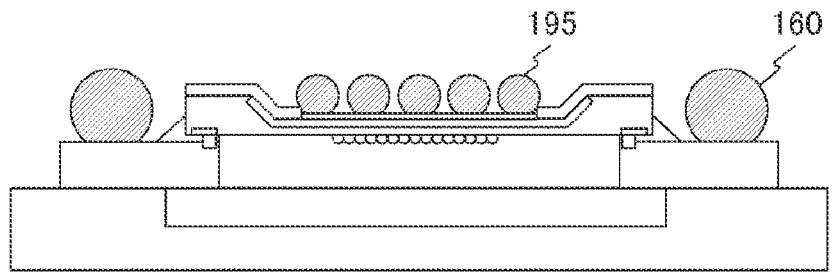
FIGS. 12A, 12B, 12C, and 12D are diagrams for describing a manufacturing process up to substrate mounting according to the second embodiment of the present technology.
Figure 12B:
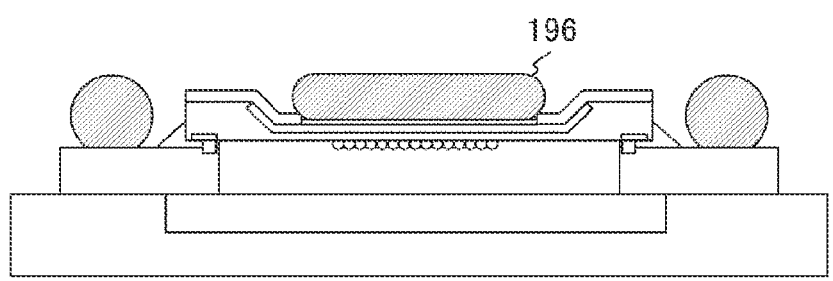
Figure 12C:
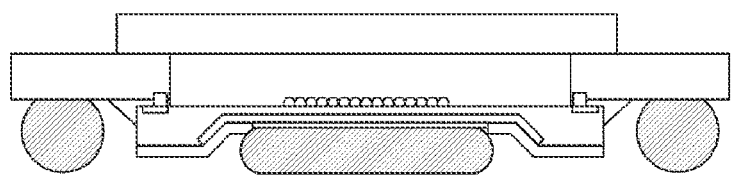
Figure 12D:
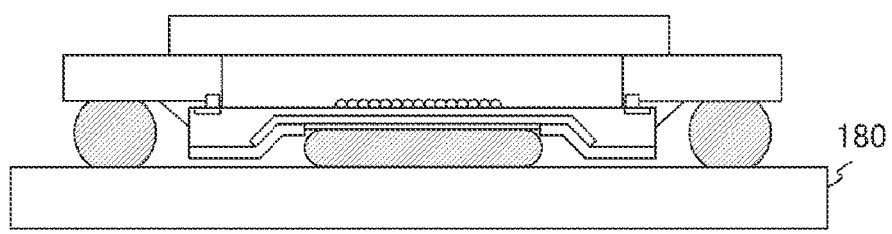

FIGS. 12A, 12B, 12C, and 12D are diagrams for describing a manufacturing process up to substrate mounting according to the second embodiment of the present technology. In the diagram, FIG. 12A is a diagram illustrating an example of the semiconductor substrate 110 and the interposer substrate 150 on which solder balls are mounted. In the diagram, FIG. 12B is a diagram for describing a process of reflow. In the diagram, FIG. 12C is a cross-sectional view illustrating a state at the end of packaging. In the diagram, FIG. 12D is a diagram for describing a process of substrate mounting.

In a state in which the protection tape is attached, as exemplified in FIG. 12A in the diagram, the manufacturing system mounts the plurality of signal transmission solder balls 160 and the plurality of heat release solder balls 195 at predetermined positions of the interposer substrate 150 and the semiconductor substrate 110.

After mounting the signal transmission solder balls 160 and the heat release solder balls 195, the manufacturing system performs reflow in the reflow furnace and joints these solder balls. At this time, as exemplified in FIG. 12B in the diagram, because an opening of a land is wide, the plurality of heat release solder balls 195 is merged and integrated by reflow, and wetly spreads. Therefore, the surface solder 196 is formed. Processes following the reflow are similar to the corresponding processes of the first embodiment.

Note that the manufacturing system forms the surface solder 196 by merging the plurality of heat release solder balls 195, but a formation method of the surface solder 196 is not limited to the method. For example, the manufacturing system can also form the surface solder 196 by applying cream solder without using the heat release solder balls 195.

In this manner, according to the second embodiment of the present technology, because the plate-shaped surface solder 196 is provided, as compared with the first embodiment in which the ball-shaped heat release solder balls 195 are disposed, a junction area can be widened. Therefore, an amount of heat release can be increased, and thermal resistance of the semiconductor substrate 110 can be further decreased.

3. Third Embodiment

In the above-described first embodiment, the insulating layer 192 of the opening 191 is covered with the film-shaped metal layer 193, and the metal layer 193 and the heat release solder balls 195 are jointed. However, if a heat release amount of the semiconductor substrate 110 is large, in some cases, an amount of heat release becomes insufficient only by the film-shaped metal layer 193, and thermal resistance cannot be sufficiently reduced. A fan-out package 100 of the third embodiment is different from that of the first embodiment in that a block-shaped metal layer is buried in the opening 191, and an amount of heat release is increased.

Figure 13:
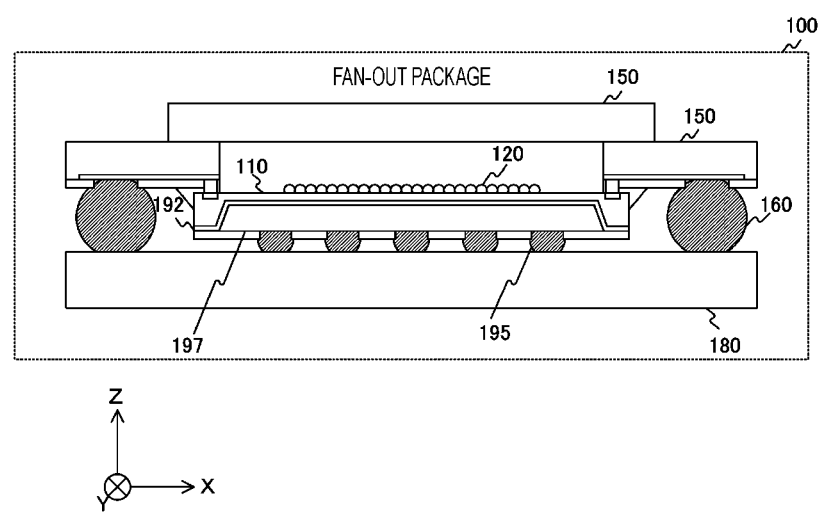
FIG. 13 is a cross-sectional view illustrating one configuration example of a fan-out package according to a third embodiment of the present technology.

FIG. 13 is a cross-sectional view illustrating one configuration example of the fan-out package 100 according to the third embodiment of the present technology. The fan-out package 100 of the third embodiment is different from that of the first embodiment in that a metal layer 197 is formed in place of the metal layer 193.

The metal layer 197 is block-shaped copper, and is buried in the opening 191 covered with the insulating layer 192. In other words, an opened space (i.e., the opening 191) of the semiconductor substrate 110 is filled with copper. In the third embodiment, because the opening 191 is blocked by the metal layer 197, the rear surface of the semiconductor substrate 110 has no unevenness and becomes planar.

The semiconductor substrate 110 itself includes monocrystalline silicon, and a thermal conductivity thereof is about 160 watts per millikelvin (W/mK). However, by filling the opening 191 of the semiconductor substrate 110 with copper having good heat release characteristics and having a thermal conductivity of about 400 watts per millikelvin (W/mK), a heat release property of the semiconductor substrate 110 itself can be enhanced. Furthermore, because the metal layer 197 formed by copper plating is buried in a recess (the opening 191) formed using anisotropic etching of silicon, it is possible to decrease thermal resistance without changing a substrate thickness in appearance. Note that the metal layer 197 is formed by an electrolytic plating method that uses a preliminarily-formed seed layer as an electrode.

Note that a plan view of the fan-out package 100 of the third embodiment is similar to that of the first embodiment.

Furthermore, among processes up to dicing of the third embodiment, processes up to a process of patterning of the insulating layer 192 are similar to those of the first embodiment exemplified in FIGS. 3A, 3B, 3C, 3D, and 3E. Hereinafter, processes different from the first embodiment will be described.

Figure 14A:
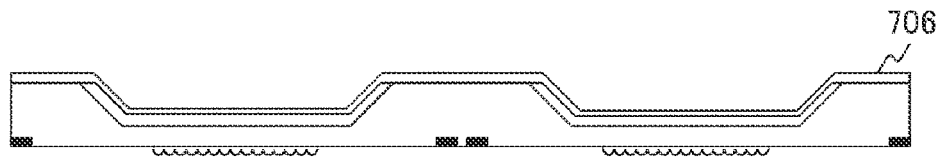
FIGS. 14A, 14B, 14C, 14D, 14E, and 14F are diagrams for describing a manufacturing process up to dicing according to the third embodiment of the present technology.
Figure 14B:
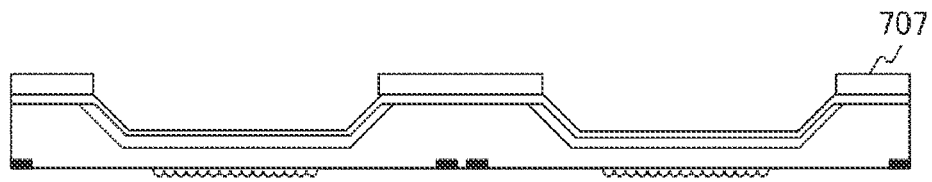
Figure 14C:
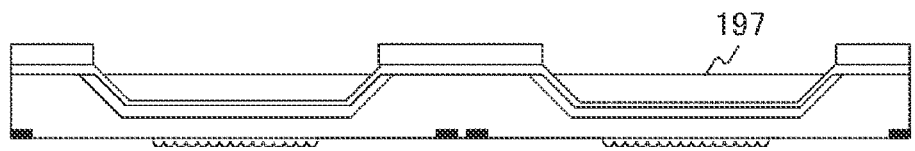
Figure 14D:
Figure 14E:
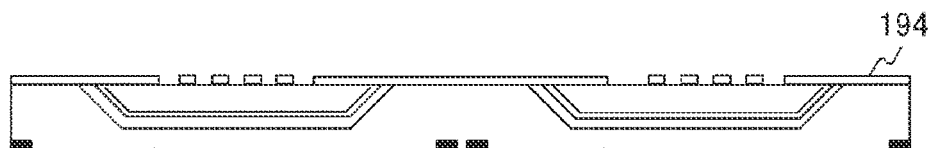
Figure 14F:
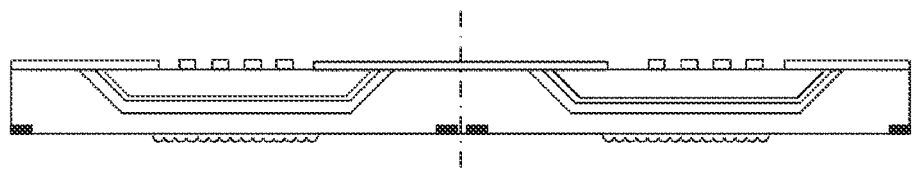

FIGS. 14A, 14B, 14C, 14D, 14E, and 14F are diagrams for describing a manufacturing process up to dicing according to the third embodiment of the present technology. In the diagram, FIG. 14A is a diagram for describing a process of application of a seed layer 706. In the diagram, FIG. 14B is a diagram for describing an application process of a plating-resistant resist 707. In the diagram, FIG. 14C is a diagram for describing a coating process of the metal layer 197. In the diagram, FIG. 14D is a diagram for describing a patterning process of the metal layer 197. In the diagram, FIG. 14E is a diagram for describing a patterning process of the solder mask 194. In the diagram, FIG. 14F is a diagram for describing a process of dicing.

As exemplified in FIG. 14A in the diagram, before the formation of the metal layer 197, the manufacturing system preliminarily forms and stacks titan and copper thin films as the seed layer 706, by a film formation process such as sputtering, for example.

As exemplified in FIG. 14B in the diagram, the manufacturing system patterns a pattern of the metal layer 197 onto the seed layer 706 by a photolithographic process. Then, the manufacturing system applies the plating-resistant resist 707, and for burying a recess (the opening 191) formed by anisotropic etching, by electrolyte copper plating, opens only the portion as a pattern.

As exemplified in FIG. 14C in the diagram, the manufacturing system applies copper plating for forming the metal layer 197. The manufacturing system causes an electrolytic plating growth of copper plating by connecting a part of the seed layer 706 formed on the wafer entire surface as a film, to an electrode of a dedicated plating jig, putting the electrode into dedicated plating solution, and flowing current in the electrode. Therefore, the metal layer 197 is buried in the opening 191.

As exemplified in FIG. 14D in the diagram, the manufacturing system detaches the plating-resistant resist 707 that has become unnecessary after the formation of the metal layer 197 by electrolytic plating in the preceding process, using dedicated detachment agent or rinse agent. After the detachment of the plating-resistant resist 707, the above-described underlying seed layer 706 is exposed, and is etched using dedicated etching agent.

As exemplified in FIG. 14E in the diagram, the manufacturing system applies the solder mask 194 onto the metal layer 197 formed in the preceding process. In the third embodiment, as compared with the first and second embodiments, because a recessed shape (the opening 191) formed by silicon anisotropic etching of a portion to which the solder mask 194 it to be applied is filled by the metal layer 197, surface unevenness is hardly generated. Thus, it is possible to use a normal spin-coating method for coating with the solder mask 194. Note that a spray-coating method may be used in place of the spin-coating method.

Furthermore, after coating, the manufacturing system forms a desired pattern by performing resist bake (solvent removal), exposure that uses a mask, and development patterning that uses predetermined developing solution, on the solder mask 194. Here, a pattern having a land shape for mounting the heat release solder balls 195 is formed.

For example, so-called "negative type" photosensitive material is used as the solder mask 194. Note that, in place of the negative type, "positive type" photosensitive material can also be used as the solder mask 194. Furthermore, the solder mask 194 may contain a filler such as silica.

Figure 15A:
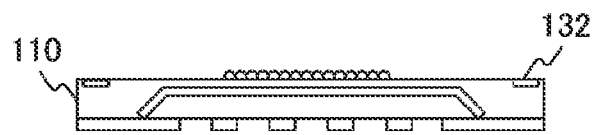
FIGS. 15A, 15B, 15C, 15D, and 15E are diagrams for describing a manufacturing process up to attachment of a lid member according to the third embodiment of the present technology.
Figure 15B:
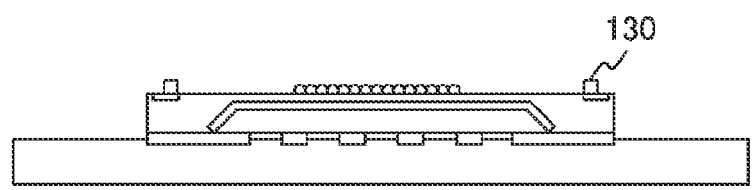
Figure 15C:
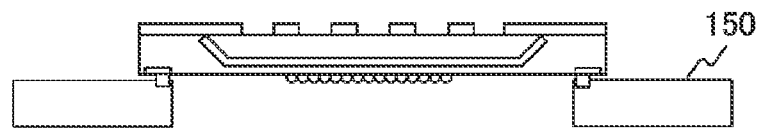
Figure 15D:
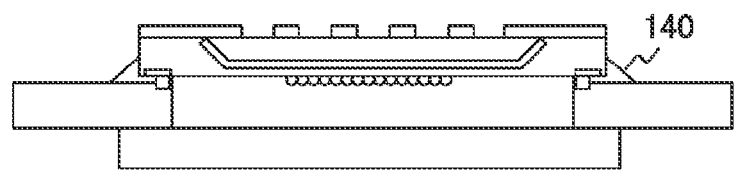
Figure 15E:
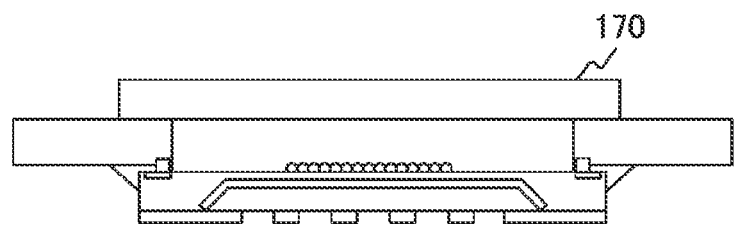

FIGS. 15A, 15B, 15C, 15D, and 15E are diagrams for describing a manufacturing process up to attachment of the lid member 170 according to the third embodiment of the present technology. In the diagram, FIG. 15A is a diagram illustrating an example of the semiconductor substrate 110 after singulation. In the diagram, FIG. 15B is a diagram for describing a process of formation of the stud bump 130. In the diagram, FIG. 15C is a diagram for describing a connection process of the interposer substrate 150. In the diagram, FIG. 15D is a diagram for describing a process of sealing. In the diagram, FIG. 15E is a diagram for describing a process of attachment of the lid member 170. The processes of the third embodiment exemplified in the diagram are similar to corresponding processes of the first embodiment.

Figure 16A:
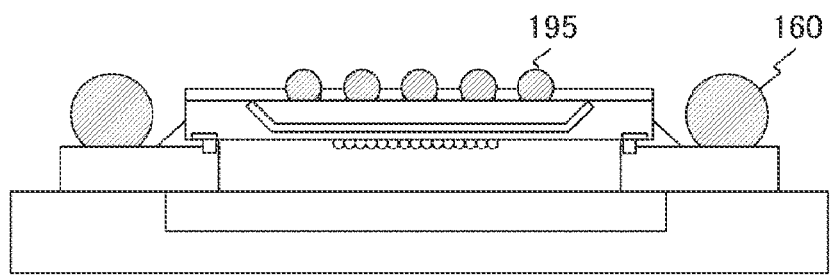
FIGS. 16A, 16B, and 16C are diagrams for describing a manufacturing process up to substrate mounting according to the third embodiment of the present technology.
Figure 16B:
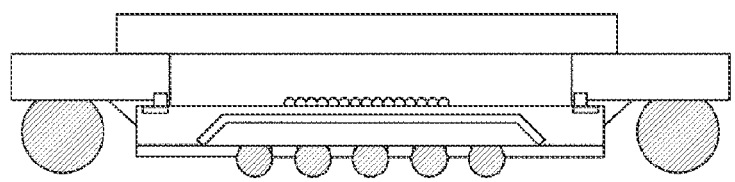
Figure 16C:
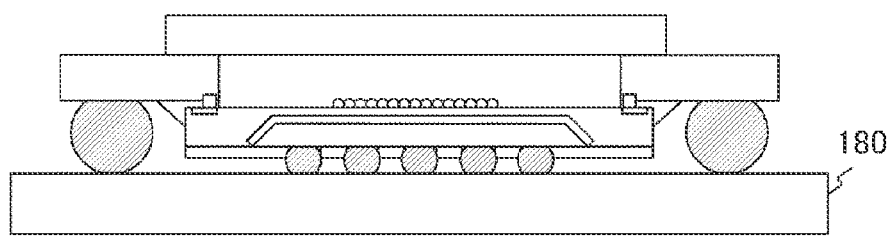

FIGS. 16A, 16B, and 16C are diagrams for describing a manufacturing process up to substrate mounting according to the first embodiment of the present technology. In the diagram, FIG. 16A is a diagram for describing a process of reflow. In the diagram, FIG. 16B is a cross-sectional view illustrating a state at the end of packaging. In the diagram, FIG. 16C is a diagram for describing a process of substrate mounting. The processes of the third embodiment exemplified in the diagram are similar to corresponding processes of the first embodiment.

In this manner, according to the third embodiment of the present technology, because the metal layer 197 is buried in the opening 191 of the semiconductor substrate 110, as compared with the first embodiment in which the opening 191 is covered with a film-shaped metal layer, an amount of heat release of the semiconductor substrate 110 can be increased.

4. Fourth Embodiment

In the above-described third embodiment, the plurality of heat release solder balls 195 is arranged between the semiconductor substrate 110 and the mounting substrate 180. However, if a heat release amount of the semiconductor substrate 110 is large, in some cases, a junction area of these heat release solder balls 195 becomes insufficient, and thermal resistance cannot be sufficiently reduced. A fan-out package 100 of the fourth embodiment is different from that of the third embodiment in that solder is formed in a planar shape and a junction area is widened.

Figure 17:
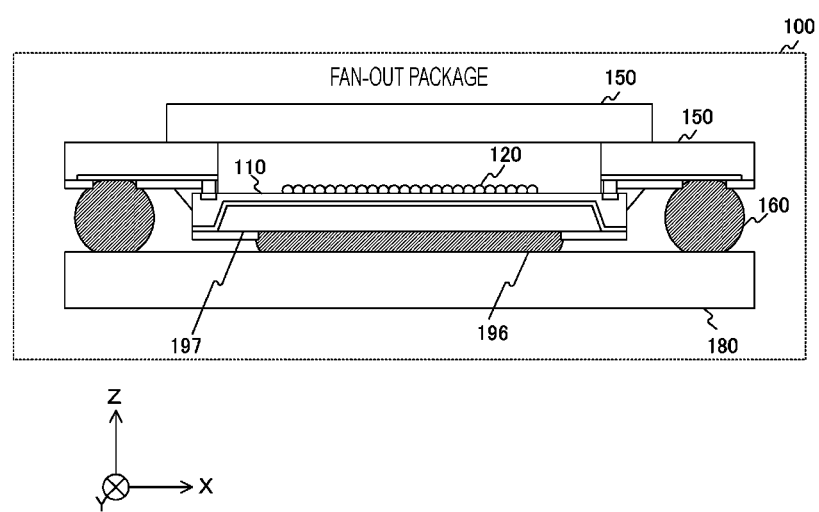
FIG. 17 is a cross-sectional view illustrating one configuration example of a fan-out package according to a fourth embodiment of the present technology.

FIG. 17 is a cross-sectional view illustrating one configuration example of the fan-out package 100 according to the fourth embodiment of the present technology. The second fan-out package 100 is different from that of the third embodiment in that a plate-shaped solder member is disposed as a surface solder 196 in place of the plurality of heat release solder balls 195.

Note that a plan view of the fan-out package 100 of the fourth embodiment is similar to that of the second embodiment.

Furthermore, processes up to dicing of the fourth embodiment are similar to those of the third embodiment.

Figure 18A:
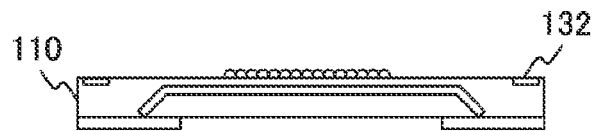
FIGS. 18A, 18B, 18C, 18D, and 18E are diagrams for describing a manufacturing process up to attachment of a lid member according to the fourth embodiment of the present technology.
Figure 18B:
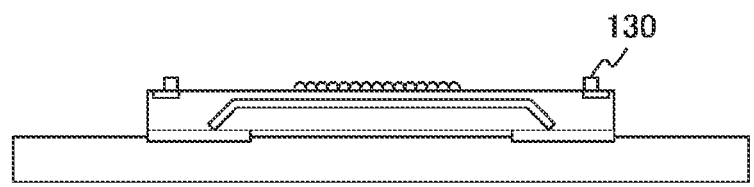
Figure 18C:
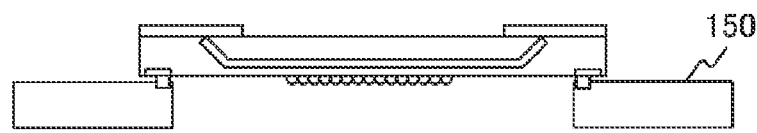
Figure 18D:
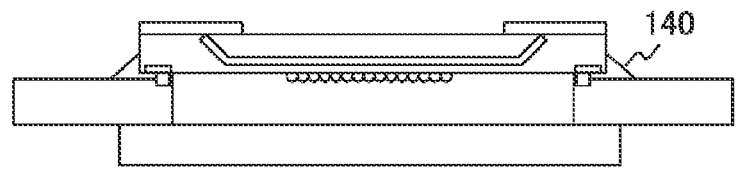
Figure 18E:
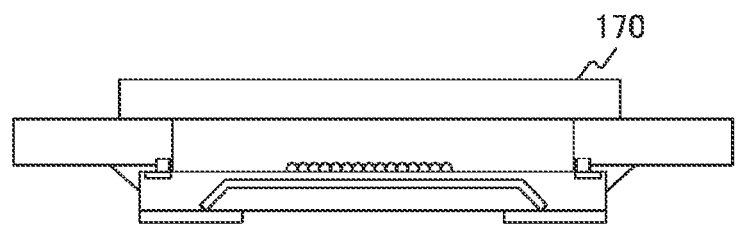

FIGS. 18A, 18B, 18C, 18D, and 18E are diagrams for describing a manufacturing process up to attachment of the lid member 170 according to the fourth embodiment of the present technology. In the diagram, FIG. 18A is a diagram illustrating an example of the semiconductor substrate 110 after singulation. In the diagram, FIG. 18B is a diagram for describing a process of formation of the stud bump 130. In the diagram, FIG. 18C is a diagram for describing a connection process of the interposer substrate 150. In the diagram, FIG. 18D is a diagram for describing a process of sealing. In the diagram, FIG. 18E is a diagram for describing a process of attachment of the lid member 170. The processes of the fourth embodiment exemplified in the diagram are similar to corresponding processes of the third embodiment.

Figure 19A:
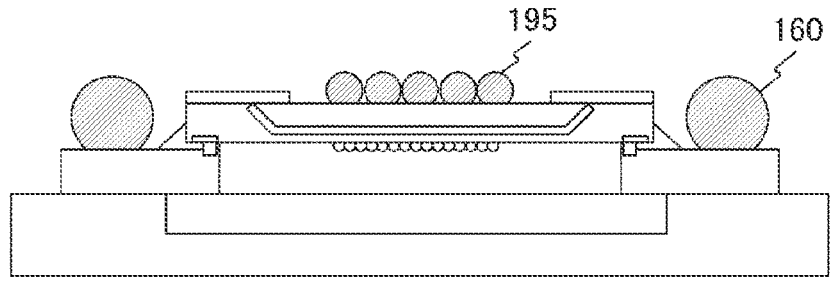
FIGS. 19A, 19B, 19C, and 19D are diagrams for describing a manufacturing process up to substrate mounting according to the fourth embodiment of the present technology.
Figure 19B:
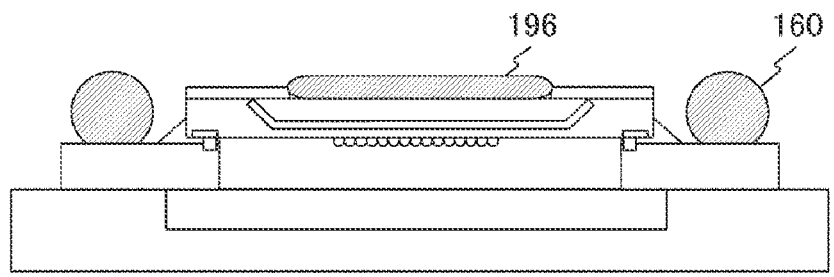
Figure 19C:
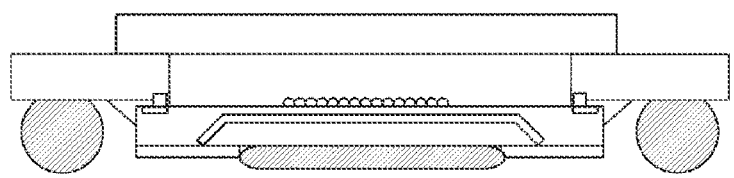
Figure 19D:
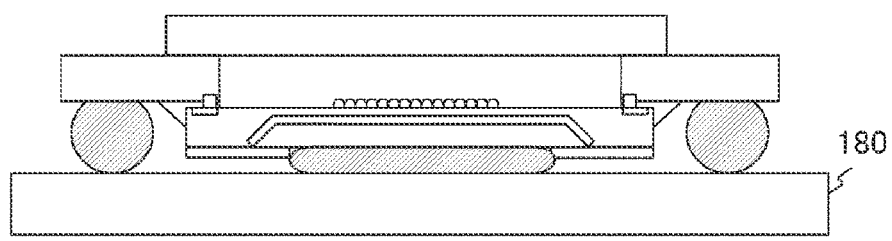

FIGS. 19A, 19B, 19C, 19D are diagrams for describing a manufacturing process up to substrate mounting according to the fourth embodiment of the present technology. In the diagram, FIG. 19A is a diagram illustrating an example of the semiconductor substrate 110 and the interposer substrate 150 on which solder balls are mounted. In the diagram, FIG. 19B is a diagram for describing a process of reflow. In the diagram, FIG. 19C is a cross-sectional view illustrating a state at the end of packaging. In the diagram, FIG. 19D is a diagram for describing a process of substrate mounting. The processes of the fourth embodiment exemplified in the diagram are similar to corresponding processes of the second embodiment.

Lastly, as for effects of the first to fourth embodiments, measurement values will be exemplified. When a thermal resistance in a comparative example in which the heat release solder balls 195 are not provided under a certain measurement condition is 22.9 degrees per wat (° C./W), a thermal resistance of the first embodiment under the same condition is reduced to 17.7 degrees per wat (° C./W), and a reduction rate is −22 percent (%). Furthermore, in the second embodiment, a thermal resistance is further reduced to 16.9 (° C./W), and a reduction rate with respect to the comparative example is −26 percent (%). In the third embodiment, a thermal resistance is further reduced to 16.9 degrees per wat (° C./W), and a reduction rate with respect to the comparative example is −26 percent (%). Furthermore, in the fourth embodiment, a thermal resistance is further reduced to 16.6 degrees per wat (° C./W), and a reduction rate with respect to the comparative example is −28 percent (%). In this manner, it is possible to reduce thermal resistance by the plurality of heat release solder balls 195. Furthermore, by replacing the heat release solder balls 195 with the surface solder 196, and burying the metal layer 197 in the opening 151, it is possible to further reduce thermal resistance.

In this manner, according to the fourth embodiment of the present technology, because the plate-shaped surface solder 196 is provided, as compared with the third embodiment in which the ball-shaped heat release solder balls 195 are disposed, a junction area can be widened. Therefore, an amount of heat release can be increased, and thermal resistance of the semiconductor substrate 110 can be further decreased.

5. Application Example to Movable Body

The technology according to the present disclosure (present technology) can be applied to various products. For example, the technology according to the present disclosure can be implemented as a device mounted on a movable body of any type of an automobile, electric car, a hybrid electric car, a motorbike, a bicycle, a personal mobility, a plane, a drone, a ship, a robot, and the like.

Figure 20:
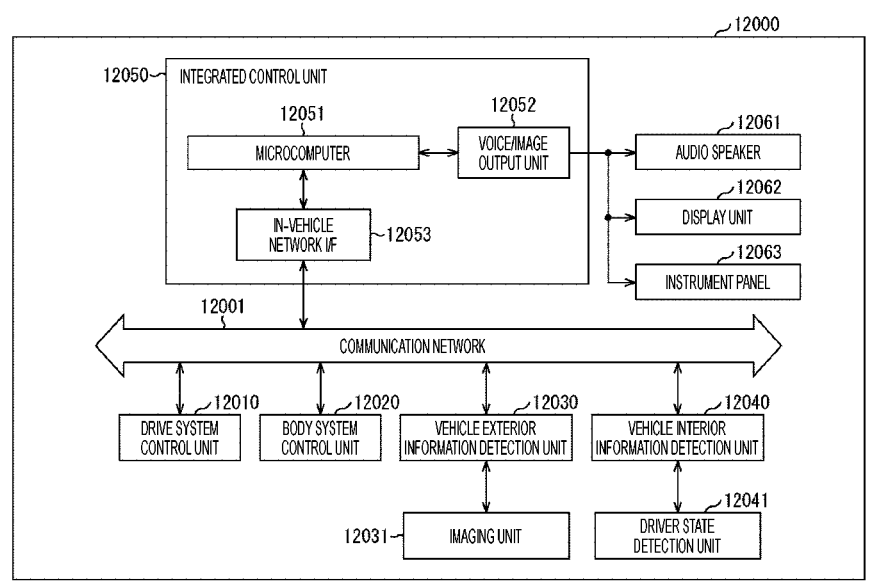
FIG. 20 is a block diagram illustrating a schematic configuration example of a vehicle control system.

FIG. 20 is a block diagram illustrating a schematic configuration example of a vehicle control system being an example of a movable body control system to which the technology according to the present disclosure can be applied.

A vehicle control system 12000 includes a plurality of electronic control units connected via a communication network 12001. In the example illustrated in FIG. 20, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a voice/image output unit 12052, and an in-vehicle network interface (I/F) 12053 are illustrated.

The drive system control unit 12010 controls operations of a device related to a drive system of a vehicle in accordance with various programs. For example, the drive system control unit 12010 functions as a control device of a drive force generation device for generating drive force of a vehicle, such as an internal-combustion engine or a driving motor, a drive force transmission mechanism for transmitting drive force to wheels, a steering mechanism for adjusting a steering angle of the vehicle, a braking device for generating braking force of the vehicle, and the like.

The body system control unit 12020 controls operations of various devices provided in a vehicle body, in accordance with various programs. For example, the body system control unit 12020 functions as a control device of a keyless entry system, a smart key system, a powered window device, or various lamps such as a headlamp, a back lam, a brake lamp, blinker, or a fog lamp. In this case, radio waves transmitted from a mobile device substituting for a key, or signals of various switches can be input to the body system control unit 12020. The body system control unit 12020 receives input of these radio waves or signals, and controls a door lock device of the vehicle, the powered window device, lamps, and the like.

The vehicle exterior information detection unit 12030 detects information regarding the outside of the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the outside of the vehicle, and receives the captured image. On the basis of the received image, the vehicle exterior information detection unit 12030 may perform object detection processing or distance detection processing of a human, a car, an obstacle, a road sign, characters on a road, and the like.

The imaging unit 12031 is an optical sensor that receives light and outputs an electrical signal corresponding to a light reception amount of the light. The imaging unit 12031 can output an electrical signal as an image, and output an electrical as information regarding distance measurement. Furthermore, light to be received by the imaging unit 12031 may be visible light, or may be invisible light such as infrared light.

The vehicle interior information detection unit 12040 detects information regarding the vehicle interior. For example, a driver state detection unit 12041 that detects a state of a driver is connected to the vehicle interior information detection unit 12040. The driver state detection unit 12041 includes a camera for capturing an image of a driver, for example. On the basis of detection information input from the driver state detection unit 12041, the vehicle interior information detection unit 12040 may calculate a fatigue degree or a concentration degree of the driver, or may determine whether or not the driver dozes off.

On the basis of information regarding the vehicle interior or vehicle exterior that is acquired from the vehicle exterior information detection unit 12030 or the vehicle interior information detection unit 12040, the microcomputer 12051 can calculate control target values of the drive force generation device, the steering mechanism, or the braking device, and output a control command to the drive system control unit 12010. For example, the microcomputer 12051 can perform cooperative control intended to implement functions of an advanced driver assistance system (ADAS) including collision avoidance or shock mitigation of the vehicle, follow-up driving that is based on an inter-vehicular distance, maintained vehicle speed driving, collision warning of the vehicle, or lane deviation warning of the vehicle, and the like.

Furthermore, the microcomputer 12051 can perform cooperative control intended for automated driving of autonomously driving without depending on the operation of a driver, or the like, by controlling the drive force generation device, the steering mechanism, the braking device, or the like on the basis of information regarding the periphery of the vehicle that is acquired from the vehicle exterior information detection unit 12030 or the vehicle interior information detection unit 12040.

Furthermore, the microcomputer 12051 can output a control command to the body system control unit 12020 on the basis of information regarding the vehicle exterior that is acquired by the vehicle exterior information detection unit 12030. For example, the microcomputer 12051 can perform cooperative control intended to achieve antidazzle by controlling a headlamp in accordance with a position of a leading vehicle or an oncoming vehicle that has been detected by the vehicle exterior information detection unit 12030, and switching high beam to low beam, or the like.

The voice/image output unit 12052 transmits an output signal of at least one of voice and an image to an output device that can visually or aurally notify an occupant of the vehicle or the vehicle exterior of information. In the example in FIG. 20, an audio speaker 12061, a display unit 12062, and an instrument panel 12063 are exemplified as output devices. The display unit 12062 may include at least one of an onboard display and a headup display, for example.

Figure 21:
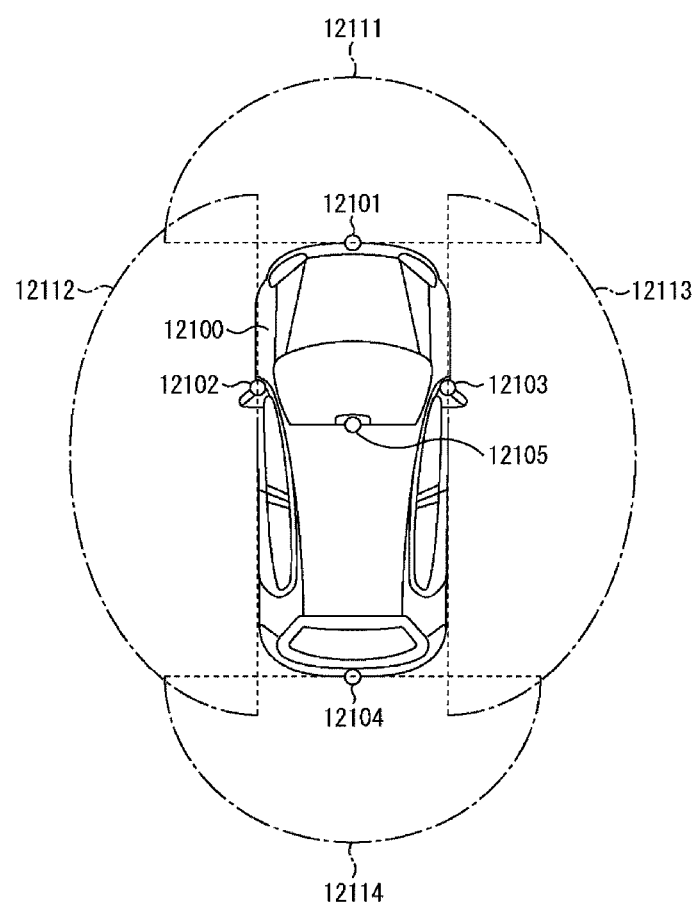
FIG. 21 is an explanatory diagram describing an example of an installation position of an imaging unit.

FIG. 21 is a diagram describing an example of an installation position of the imaging unit 12031.

In FIG. 21, imaging units 12101, 12102, 12103, 12104, and 12105 are included as the imaging unit 12031.

The imaging units 12101, 12102, 12103, 12104, and 12105 are provided at positions such as a front nose of a vehicle 12100, side mirrors, a rear bumper, a backdoor, and an upper part of a front window inside a vehicle room, for example. The imaging unit 12101 provided at the front nose and the imaging unit 12105 provided at the upper part of the front window inside the vehicle room mainly acquire images of a front side of the vehicle 12100. The imaging units 12102 and 12103 provided at the side mirrors mainly acquire images of the sides of the vehicle 12100. The imaging unit 12104 provided at the rear bumper or the backdoor mainly acquires images of the rear side of the vehicle 12100. The imaging unit 12105 provided at the upper part of the front window inside the vehicle room is mainly used for the detection of a leading vehicle, a pedestrian, an obstacle, a traffic light, a traffic sign, a traffic lane, or the like.

Note that FIG. 21 illustrates an example of image capturing ranges of the imaging units 12101 to 12104. An image capturing range 12111 indicates an image capturing range of the imaging unit 12101 provided at the front nose, image capturing ranges 12112 and 12113 respectively indicate image capturing ranges of the imaging units 12102 and 12103 provided at the side mirrors, and an image capturing range 12114 indicates an image capturing range of the imaging unit 12104 provided at the rear bumper or the backdoor. For example, a birds-eye image of the vehicle 12100 viewed from above is obtained by overlapping image data captured by the imaging units 12101 to 12104.

At least one of the imaging units 12101 to 12104 has a function of acquiring distance information. For example, at least one of the imaging units 12101 to 12104 may be a stereo camera including a plurality of image sensors, or may be an image sensor including pixels for phase difference detection.

For example, by obtaining a distance to each three-dimensional object in the image capturing ranges 12111 to 12114, and a temporal variation (relative speed with respect to the vehicle 12100) of the distance, on the basis of distance information obtained from the imaging units 12101 to 12104, the microcomputer 12051 can especially extract, as a leading vehicle, a three-dimensional object that is the closest three-dimensional object existing on a travelling path of the vehicle 12100, and is running at a predetermined speed (for example, equal to or larger than 0 km/h) in substantially the same direction as the vehicle 12100. Moreover, the microcomputer 12051 can preliminarily set an inter-vehicular distance to be ensured in front of a leading vehicle, and perform automatic brake control (including follow-up stop control), automatic acceleration control (including follow-up departure control), and the like. In this manner, cooperative control intended for automated driving of autonomously driving without depending on the operation of a driver, or the like can be performed.

For example, on the basis of distance information obtained from the imaging units 12101 to 12104, the microcomputer 12051 can extract three-dimensional object data regarding a three-dimensional object, while classifying three-dimensional objects into other three-dimensional objects such as a two-wheeled vehicle, a standard-sized vehicle, a large-sized vehicle, a pedestrian, and a telephone pole, and use the extracted three-dimensional object data for automatic avoidance of an obstacle. For example, the microcomputer 12051 identifies obstacles near the vehicle 12100, as an obstacle visible by a driver of the vehicle 12100, and an obstacle less-visible by the driver. Then, the microcomputer 12051 determines collision risk indicating a degree of risk of collision with each obstacle, and when the collision risk is equal to or larger than a setting value and there is a possibility of collision, the microcomputer 12051 can perform drive assist for collision avoidance by outputting a warning to the driver via the audio speaker 12061 or the display unit 12062, and performing forced deceleration or avoidance steering via the drive system control unit 12010.

At least one of the imaging units 12101 to 12104 may be an infrared camera that detects infrared light. For example, the microcomputer 12051 can recognize a pedestrian by determining whether or not a pedestrian exists in captured images of the imaging units 12101 to 12104. The recognition of a pedestrian is performed by a procedure of extracting a feature point in captured images of the imaging units 12101 to 12104 serving as infrared cameras, and a procedure of determining whether or not a detected object is a pedestrian, by performing pattern matching processing on a series of feature points indicating an outline of an object, for example. If the microcomputer 12051 determines that a pedestrian exists in captured images of the imaging units 12101 to 12104, and recognizes the pedestrian, the voice/image output unit 12052 controls the display unit 12062 to display a rectangular profile line for enhancement, with being superimposed on the recognized pedestrian. Furthermore, the voice/image output unit 12052 may control the display unit 12062 to display an icon indicating the pedestrian, or the like at a desired position.

Heretofore, an example of the vehicle control system to which the technology according to the present disclosure can be applied has been described. The technology according to the present disclosure can be applied to the imaging unit 12031, for example, among the configurations described above. Specifically, the fan-out package 100 in FIG. 1 can be applied to the imaging unit 12031. By applying the technology according to the present disclosure to the imaging unit 12031, it becomes possible to reduce thermal resistance of a solid-state image sensor, and enhance reliability of a vehicle control system.

Note that the above-described embodiment indicates an example for embodying the present technology, and items in the embodiment and items identifying the invention in the appended claims have correspondence relationship. Similarly, items identifying the invention in the appended claims, and items having the same names in the embodiment of the present technology have correspondence relationship. Nevertheless, the present technology is not limited to the embodiment, and can be embodied by making various modifications on the embodiment without departing from the gist thereof.

Note that effects described in this specification are mere exemplifications and are not limited, and other effects may be caused.

Note that the present technology can also employ the following configurations.

(1) A semiconductor package including:
a semiconductor substrate having one surface on which a pad is provided;
an insulating layer configured to cover a different surface of the semiconductor substrate;
a metal layer configured to cover the insulating layer;
an interposer substrate on which a wire to be connected to the pad is formed;
a signal transmission solder ball that is to be jointed to the wire and a predetermined mounting substrate, and configured to transmit a predetermined electrical signal; and
a solder member to be jointed to the metal layer and the mounting substrate.

(2) The semiconductor package according to (1) described above,
in which the solder member includes a plurality of heat release solder balls.

(3) The semiconductor package according to (1) described above, in which a shape of the solder member is a plate shape.

(4) The semiconductor package according to any of (1) to (3) described above,
in which an opening is formed on the different surface of the semiconductor substrate,
the insulating layer covers the opening, and
the metal layer is buried in the opening.

(5) The semiconductor package according to any of (1) to (4) described above,
in which material of the insulating layer is ceramic.

(6) The semiconductor package according to (5) described above,
in which the ceramic is alumina.

(7) The semiconductor package according to (5) described above,
in which the ceramic is silicon carbide.

(8) The semiconductor package according to any of (1) to (7) described above,
in which material of the metal layer contains copper.

(9) The semiconductor package according to any of (1) to (8) described above, further including
a lid member connected to the interposer substrate,
in which a solid-state image sensor is further formed on the semiconductor substrate.

(10) A manufacturing method of a semiconductor package, the manufacturing method including:
an insulating layer coating procedure of forming a film of an insulating layer on a different surface of a semiconductor substrate having one surface on which a pad is provided;
a metal layer coating procedure of forming a film of a metal layer on the insulating layer;
a bonding procedure of connecting a wire formed on an interposer substrate, to the pad; and
a jointing procedure of jointing a signal transmission solder ball configured to transmit a predetermined electrical signal, to the wire, and jointing a solder member to the metal layer.

(11) The manufacturing method of a semiconductor package according to (10) described above,
in which the solder member has a plate shape.

(12) The manufacturing method of a semiconductor package according to (11) described above, the manufacturing method further including
a mounting procedure of mounting a plurality of heat release solder balls on the metal layer,
in which, in the jointing procedure, the solder member is formed by merging the plurality of heat release solder balls.

(13) The manufacturing method of a semiconductor package according to (11) described above,
in which, in the jointing procedure, the solder member is formed by applying cream solder to the metal layer.

(14) The manufacturing method of a semiconductor package according to any of (10) to (13) described above, the manufacturing method further including
an opening procedure of forming an opening by opening the different surface of the semiconductor substrate by etching,
in which, in the insulating layer coating procedure, a film of the insulating layer is formed on an opening surface of the opening, and
in the metal layer coating procedure, the metal layer is buried in the opening.

REFERENCE SIGNS LIST

100 Fan-out package
110 Semiconductor substrate
120 Solid-state image sensor
130 Stud bump
132 Pad
140 Seal resin
150 Interposer substrate 151 Cavity
152 Interposer wire
153, 194 Solder mask
160 Signal transmission solder ball
170 Lid member
180 Mounting substrate
191 Opening
192 Insulating layer
193, 197 Metal layer
195 Heat release solder ball
196 Surface solder
12031 Imaging unit

The invention claimed is:

1. A semiconductor package, comprising:
a semiconductor substrate and a pad provided on one surface of the semiconductor substrate;
an insulating layer configured to cover a different surface of the semiconductor substrate;
a metal layer configured to cover the insulating layer;
an interposer substrate on which a wire, configured to connect to the pad, is formed;
a signal transmission solder ball configured to join the wire and a predetermined mounting substrate to transmit a predetermined electrical signal; and
a solder member configured to join the metal layer and the predetermined mounting substrate.

2. The semiconductor package according to claim 1, wherein the solder member includes a plurality of heat release solder balls.

3. The semiconductor package according to claim 1, wherein a shape of the solder member is a plate shape.

4. The semiconductor package according to claim 1, wherein an opening is formed on the different surface of the semiconductor substrate,
the insulating layer covers the opening, and
the metal layer is buried in the opening.

5. The semiconductor package according to claim 1, wherein material of the insulating layer is ceramic.

6. The semiconductor package according to claim 5, wherein the ceramic is alumina.

7. The semiconductor package according to claim 5, wherein the ceramic is silicon carbide.

8. The semiconductor package according to claim 1, wherein material of the metal layer contains copper.

9. The semiconductor package according to claim 1, further comprising:
a lid member connected to the interposer substrate,
wherein a solid-state image sensor is further formed on the one surface of the semiconductor substrate.

10. A manufacturing method of a semiconductor package, the manufacturing method comprising:
an insulating layer coating procedure of forming a film of an insulating layer on a different surface of a semiconductor substrate that includes one surface on which a pad is provided;
a metal layer coating procedure of forming a film of a metal layer on the insulating layer;
a bonding procedure of connecting a wire formed on an interposer substrate, to the pad; and
a joining procedure of joining a signal transmission solder ball configured to transmit a predetermined electrical signal, to the wire, and joining a solder member to the metal layer.

11. The manufacturing method of the semiconductor package according to claim 10,
wherein the solder member has a plate shape.

12. The manufacturing method of the semiconductor package according to claim 11, the manufacturing method further comprising:
a mounting procedure of mounting a plurality of heat release solder balls on the metal layer,
wherein, in the joining procedure, the solder member is formed by merging the plurality of heat release solder balls.

13. The manufacturing method of the semiconductor package according to claim 11,
wherein, in the joining procedure, the solder member is formed by applying cream solder to the metal layer.

14. The manufacturing method of the semiconductor package according to claim 10, the manufacturing method further comprising
an opening procedure of forming an opening by opening the different surface of the semiconductor substrate by etching, wherein:
in the insulating layer coating procedure, a film of the insulating layer is formed on an opening surface of the opening, and
in the metal layer coating procedure, the metal layer is buried in the opening.

* * * * *